(12) United States Patent
Hekmatshoartabari et al.

(10) Patent No.: US 11,271,108 B2
(45) Date of Patent: Mar. 8, 2022

(54) LOW-NOISE GATE-ALL-AROUND JUNCTION FIELD EFFECT TRANSISTOR

(71) Applicant: International Business Machines Corporation, Armonk, NY (US)

(72) Inventors: Bahman Hekmatshoartabari, White Plains, NY (US); Alexander Reznicek, Troy, NY (US); Karthik Balakrishnan, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 13 days.

(21) Appl. No.: 16/843,607

(22) Filed: Apr. 8, 2020

(65) Prior Publication Data

US 2021/0320205 A1    Oct. 14, 2021

(51) Int. Cl.
*H01L 29/78* (2006.01)
*H01L 29/786* (2006.01)
*H01L 29/66* (2006.01)
*H01L 29/423* (2006.01)

(52) U.S. Cl.
CPC .... *H01L 29/7832* (2013.01); *H01L 29/42372* (2013.01); *H01L 29/66666* (2013.01); *H01L 29/66909* (2013.01); *H01L 29/78642* (2013.01)

(58) Field of Classification Search
CPC .......... H01L 29/7832; H01L 29/42372; H01L 29/66909; H01L 29/66666; H01L 29/78642
See application file for complete search history.

(56) References Cited

U.S. PATENT DOCUMENTS

| | | |
|---|---|---|
| 4,062,036 A | 12/1977 | Yoshida |
| 5,714,777 A | 2/1998 | Ismail et al. |
| 7,969,243 B2 | 6/2011 | Bracale et al. |
| 7,977,714 B2 | 7/2011 | Ellis-Monaghan et al. |
| 8,623,722 B2 | 1/2014 | Mouli |
| 9,876,110 B2 | 1/2018 | Gimbert |
| 10,056,379 B1 | 8/2018 | Balakrishnan et al. |

(Continued)

OTHER PUBLICATIONS

"CMOS-Integrated Low-Noise Junction Field-Effect Transistors for Bioelectronic Applications" Daniel A. Fleischer; Siddharth Shekar; Shanshan Dai; Ryan M. Field; Jenifer Lary; Jacob K. Rosenstein; Kenneth L. Shepard IEEE Electron Device Letters, Year: 2018, vol. 39, Issue: 7, pp. 931-934.

(Continued)

*Primary Examiner* — Edward Chin
(74) *Attorney, Agent, or Firm* — Daniel P. Morris; Lou Percello, Attorney, PLLC

(57) ABSTRACT

A Vertical Function Field Effect Transistor (VIFET) is disclosed with reduced noise and input capacitance and high input impedance. The VIFET has a substrate; a source disposed on the substrate; a drain, and a channel. The vertical channel has one or more channel sidewall surfaces. The channel sidewall surfaces have a total or aggregate channel sidewall surface area. A semiconductor gate grown on one or more of the channel sidewall surfaces has a thickness below 10 nanometers (nm), or between 3 am and 10 om, that reduces transistor noise. The interface surface area between the conductive (e.g. metal) external electrical gate contact and the contacted surface of the semiconductor gate is minimized to further reduce transistor noise.

20 Claims, 35 Drawing Sheets

(56) References Cited

U.S. PATENT DOCUMENTS

2009/0184734 A1    7/2009  Kapoor
2016/0079400 A1    9/2016  Huang et al.
2017/0077270 A1*   3/2017  Liu ................... H01L 29/41741

OTHER PUBLICATIONS

"A CMOS-Process-Compatible Low-Voltage Junction-FET With Adjustable Pinch-Off Voltage" Karuna Nidhi; Ming-Dou Ker IEEE Transactions on Electron Devices Year: 2017, vol. 64, Issue: 7, pp. 2812-2819.

"A JFET-CMOS Fast Preamplifier for Segmented Germanium Detectors" A. Pullia, F. Zocca; S. Riboldi IEEE Transactions on Nuclear Science Year: 2008, vol. 55, Issue: 1, pp. 591-594.

* cited by examiner

LOW-NOISE GATE-ALL-AROUND JUNCTION FIELD EFFECT TRANSISTOR

BACKGROUND

The present invention relates to Field Effect Transistors (FETs). More specifically, the invention relates to low-noise Junction Field Effect Transistors (JFETs).

Low-noise amplifiers, and the transistors used in such amplifiers, have a myriad of uses. For example, low-noise components are essential in life sciences where they are used for acquisition of signals in various biological and biochemical applications. Emerging mobile and Internet of Things (IoT) applications require low-power and low-noise devices. Even higher power and larger battery driven IoT devices can benefit from low noise and high input impedance while running in a low voltage mode. There is also a renewed interest in the low-noise analog implementation of neural networks where low-noise amplifiers are used in conjunction with other system components for efficient/low-power implementation of cognitive tasks such as pattern recognition and natural language processing.

The input stage of a low-noise amplifier typically is a transconductance amplifier configured as either a trans-impedance amplifier or voltage amplifier. (Transconductance amplifiers can have a differential voltage input and a current output.)

Many prior art low-noise systems are rack-mounted, but there is increasing interest in Complementary Metal Oxide Semiconductor (CMOS) implementations of these electronics to enable closer integration of the sensor and amplifier.

Junction field-effect transistors (JFETs) are semiconductor devices which exhibit low noise and high input impedance. As a result, JFETs can be useful to construct devices as low-noise ring oscillators, memory devices, and operational amplifiers with high input-impedance and/or very high current-gain. Operational amplifiers can be viewed as essential building blocks of analog electronics in general and are often used in the systems referenced above.

In commercial low-noise amplifiers, large discrete JFET devices are often used in the input stages due to their superior flicker noise performance. However, FET devices are not generally available in CMOS processes.

More generally, noise reduction is a problem in CMOS devices, as well. Reducing the flicker noise in CMOS devices requires increasing the input device size, which results in additional circuit area, power consumption, and input capacitance. Larger input capacitance degrades the high frequency noise performance of trans-impedance amplifiers. In voltage amplifiers, the large input capacitance increases the voltage division of the input signal, reducing signal input strength.

There is a need for improved JFETs with low-noise and reduced input capacitance. There is a need for device structures and methods that allow monolithic integration of low-noise JFETs in CMOS technologies. In addition, there is a need to have JFET input stages integrated in CMOS technologies that have reduced input capacitance and low noise.

SUMMARY

Various embodiments of a Vertical Junction Field Effect Transistor (VJFET) are disclosed. The VJFET has a substrate; a source disposed on the substrate; a drain; and a channel. The channel has a source end connected to the source, a drain end connected to the drain, a channel region (vertical and perpendicular to the substrate) through which carriers flow between the source and drain, and one or more channel sidewall surfaces. The channel sidewall surfaces have a total or aggregate channel sidewall surface area.

A gate, made of semiconductor material, is grown on one or more of the channel sidewall surfaces. In some embodiments, the thickness of the gate is kept below 10 nanometers (nm), or between 3 nm and 10 nm. The thinness of the gate, and the resultant reduced volume of the gate, reduces the generated noise. In some embodiments, the gate is (grown) on all channel sidewall surfaces, i.e. the gate is "all around".

One or more external electrical contacts is made to each of the source, drain, and gate. Different embodiments minimize the interface surface area between the conductive (e.g. metal) external electrical gate contact and the contacted surface of the semiconductor gate. Reducing this interface surface area to be much smaller than the total channel sidewall surface area reduces noise created in the channel region and reduces input capacitance.

Alternative structures and methods of making the VJFETs are disclosed.

BRIEF DESCRIPTION OF THE DRAWINGS

Various embodiments of the present invention will be described below in more detail, with reference to the accompanying drawings, now briefly described. The Figures show various apparatus, structures, and related method steps of the present invention.

DETAILED DESCRIPTION

Figure 1:
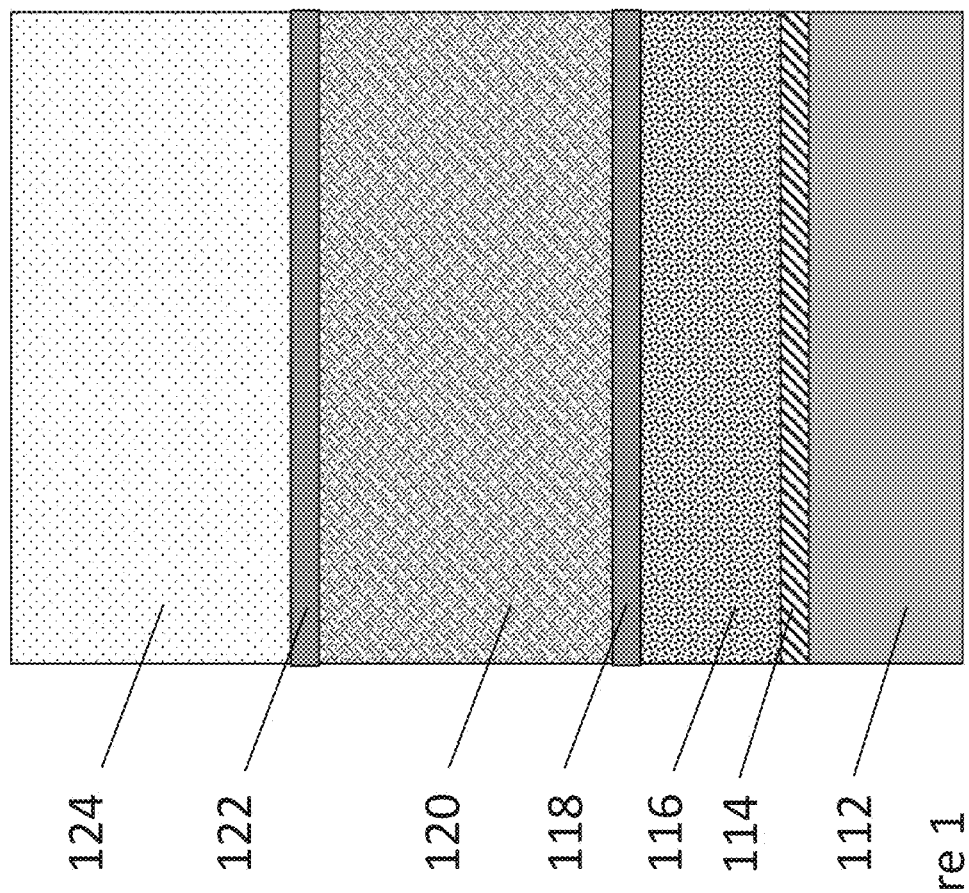
FIG. 1 is a cross-sectional view of one embodiment of a preliminary structure (e.g. stack) used to make a Junction Field Effect Transistor (JFET).

It is to be understood that embodiments of the present invention are not limited to the illustrative methods, apparatus, structures, systems and devices disclosed herein but instead are more broadly applicable to other alternative and broader methods, apparatus, structures, systems and devices that become evident to those skilled in the art given this disclosure.

In addition, it is to be understood that the various layers, structures, and/or regions shown in the accompanying drawings are not drawn to scale, and that one or more layers, structures, and/or regions of a type commonly used may not be explicitly shown in a given drawing. This does not imply that the layers, structures, and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures may not be repeated for each of the drawings.

The semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, neural networks, etc. Systems and hardware incorporating the semiconductor devices and structures are contemplated embodiments of the invention.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "lateral," "lateral side," "side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width", "height", or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

Flicker noise of a field-effect transistor scales inversely with area, 1/(W×L), where W is the channel width and L is the channel length of the transistor. Using a larger input stage transistor in an amplifier reduces amplifier noise but it also increases the gate-to-source ($C_{GS}$) and gate-to-drain ($C_{GD}$) capacitance of the input stage, since these capacitances directly scale with the area (W×L) of the input transistor. For example, the input capacitance of the input transistor typically is given by:

$$C_{in} \approx C_{GS} + C_{GD}(1 + g_{m\_AMP}/g_{m\_Load})$$

where $g_{m\_AMP}$ and $g_{m\_LOAD}$ represent the transconductance of the amplifying and load transistors in the input stage, respectively.

Because of capacitive voltage division (e.g. due to the series connection of $C_{GS}$ and $C_{GD}$), the received input (e.g. a biological and/or biochemical signal) is reduced. Therefore, while noise is reduced using the larger input components, the signal is also reduced. In addition, a large $C_{in}$ slows down the amplifier (e.g. decreases frequency bandwidth) and takes up area.

These problems can be resolved by using a JFET with decreased input component area (W×L). Embodiments of the FET are created using CMOS technologies, e.g. in the input stage of an amplifier. As known in the art, noise can be produced by the flow of minority carriers generated both within the gate and at the gate/electrical contact interface. Volumes/thicknesses of components that generate noise, i.e. the gate and connections to the gate regions, are reduced in the disclosed structures and manufacturing processes. In addition, the gate regions are passivated with dielectric. Further, contact areas/interfaces between the gate and external electrical gate contacts are reduced to reduce input capacitance.

Embodiments of the present invention include device structures and fabrication methods for vertical gate-all-around, low-noise, and increased gain FET devices that are compatible with state-of-the-art CMOS technologies.

In illustrative embodiments, junction FETs with alternative structures and techniques for fabricating these alternative embodiments of the JFETs are disclosed. More particularly, illustrative embodiments are disclosed that relate to vertical junction FETs with dual-, tri- or all-around junction gates, which, with respect to conventional structures, effectively cut in half (or less) the voltage requirement to control the junction of the JFET. By having a gate on both sides of a channel, only half (or less, for tri- or all-around gate structures) of the voltage is needed to create the same channel depletion region as compared with a single channel side gate structure. Thus, when the gate is on multiple sides of the channel, less bias voltage need be applied to the gate to turn the channel current flow on or off (and/or control the current flow) in the junction FET. This enables low power/lower voltage applications of JFETs and higher device gains.

Vertical FET (VFET) devices include channels with source/drain regions at ends of the channels, e.g. on the top and bottom ends of the channel regions. Current flows through the channels in a vertical direction (e.g., perpendicular to a substrate), for example, from a bottom source/drain region to a top source/drain region. In a JFET, the gate is made of a semiconductor material that forms a p-n junction with the channel side(s) and controls the flow of current between the source and drain (S/D) by varying a depletion layer/region formed in the channel by a bias voltage applied to the gate. VJFETs take up a smaller footprint than typical FinFETs.

Refer to the Figures.

FIG. 1 is a cross-sectional view of one embodiment of a preliminary structure 100 used to make a Vertical Junction Field Effect Transistor (VJFET).

The structure 100 is a preliminary vertical structure with a substrate 112. In one embodiment, a semiconductor substrate 112 includes semiconductor material including, but not necessarily limited to, silicon (Si), silicon germanium (SiGe), Si:C (carbon doped silicon), silicon germanium carbide (SiGeC), carbon doped silicon germanium (SiGe:C), II-V compound semiconductor or other like semiconductor. In addition, multiple layers of the semiconductor materials can be used as the semiconductor material of the substrate 112. The semiconductor substrate 112 can be a bulk substrate or a silicon-on-insulator (SOI) substrate including a buried insulating layer, such as, for example, a buried oxide or nitride layer.

A counter-doped layer 114 is formed on the substrate 112. The counter-doped layer 114 forms by a punch through stop (PTS) layer, the counter-doped layer 114 being a doped region. The counter-doped layer 114 can be made, for example, of doped silicon and is doped differently (i.e., with opposite doping) than the doping of the substrate 112. In embodiments where the substrate 112 is an SOI substrate, the counter-doped layer 114 is optional and may be omitted. The source/drain (S/D) region/layer 116 is comprised of a heavily doped semiconductor layer 116.

In a non-limiting illustrative example, the doping of the counter-doped layer 114 can be, for instance, arsenic (As) or phosphorous (P) for p-type doping and boron (B) for n-type doping. The counter-doped layer 114 doping concentrations are in the general range of $5\times10^{18}/cm^3$ to $10^{20}/cm^3$ to suppress the current leakage. A thickness of the counter-doped layer 114 can be approximately 10 nanometers (nm) to about 100 nm or alternatively between 50 nm and 100 nm.

A heavily doped source/drain layer 116 is epitaxially grown on the counter-doped layer 114. The heavily doped source/drain layer 116 can be formed by a bottom-up epitaxial growth process, wherein the heavily doped source/drain layer 116 is grown to certain height (thickness) such as, but not necessarily limited to between about 50 nm and about 250 nm, with some embodiments being between about 100 nm and about 200 nm and with some embodiments between 20 nm and 30 nm. The epitaxially grown source/drain layer 116 can be doped using processes, such as, for example, ion implantation, in situ, gas phase doping, plasma doping, plasma immersion ion implantation, cluster doping, infusion doping, liquid phase doping, solid phase doping, etc. Dopants may include, for example, an n-type dopant selected from a group of phosphorus (P), arsenic (As), and antimony (Sb); and a p-type dopant selected from a group of boron (B), gallium (Ga), indium (In), and thallium (Tl) at various concentrations. For example, in a non-limiting example, a dopant concentration range may be between $10^{20}/cm^3$ to $10^{21}/cm^3$, with some embodiments being between $2\times10^{20}/cm^3$ to $4\times10^{21}/cm^3$. The source/drain layer 116 is made from, but is not necessarily limited to, silicon (Si), silicon germanium (SiGe), or other semiconductor material.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition (CVD) type apparatus, such as a plasma enhanced CVD (PECVD) apparatus. Different types of sources may be used for the epitaxial deposition of the in-situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, disilane and combinations thereof. In other examples, when the in-situ doped semiconductor material includes germanium, a germanium gas source may be selected from the group consisting of germane, digermane, halogermane, dichlorogermane, trichlorogermane, tetrachlorogermane and combinations thereof. The temperature for epitaxial silicon germanium (SiGe) deposition typically ranges from 450° Celsius (C) to 900° C. Although higher temperature typically results in faster deposition, the faster deposition may result in crystal defects and film cracking.

By "in-situ" it is meant that the dopant that dictates the conductivity type of doped layer is introduced during the process step, e.g., epitaxial deposition, that forms the doped layer.

A bottom spacer layer 118 is then deposited on the heavily doped source/drain layer 116. The bottom spacer layer 118 materials include, but are not necessarily limited to, low-K dielectric materials, like a nitride, such as, silicon nitride (SiN), siliconborocarbonitride (SiBCN), silicon oxycarbonitride (SiOCN), and silicon oxynitride (SiON).

The bottom spacer layer 118 is deposited using, for example, directional deposition techniques, including, but not necessarily limited to high density plasma (HDP) deposition and gas cluster ion beam (GCIB) deposition, and/or deposition techniques including CVD, PECVD, radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering.

A sacrificial (placeholder) layer 120, comprising for example, amorphous silicon (α-Si) or polycrystalline silicon (polysilicon), is deposited on the bottom spacer layer 118 using, for example, deposition techniques including, but not limited to, CVD, PECVD, RFCVD, PVD, ALD, MLD, MBD, PLD, LSMCD, and/or sputtering.

A top spacer layer 122 is deposited on the top surface of sacrificial layer 120, followed by an oxide layer 124 disposed on the top spacer layer 122.

The top spacer layer 122 material includes, but is not necessarily limited to, low-K dielectric materials, including, but not necessarily limited to, a nitride, such as, SiBCN, SiOCN, SiN or $SiO_2$(silicon dioxide), deposited using, for example, directional deposition techniques, including, but not necessarily limited to high density plasma (HDP) deposition and gas cluster ion beam (GCIB) deposition, or deposition techniques including, but not limited to, CVD, PECVD, RFCVD, PVD, ALD, MLD, MBD, PLD, LSMCD, and/or sputtering.

In some embodiments, the bottom spacer layer 118 and the top spacer layer 122 are made from SiN and the oxide layer 124 is made from silicon oxide ($SiO_2$).

Figure 2:
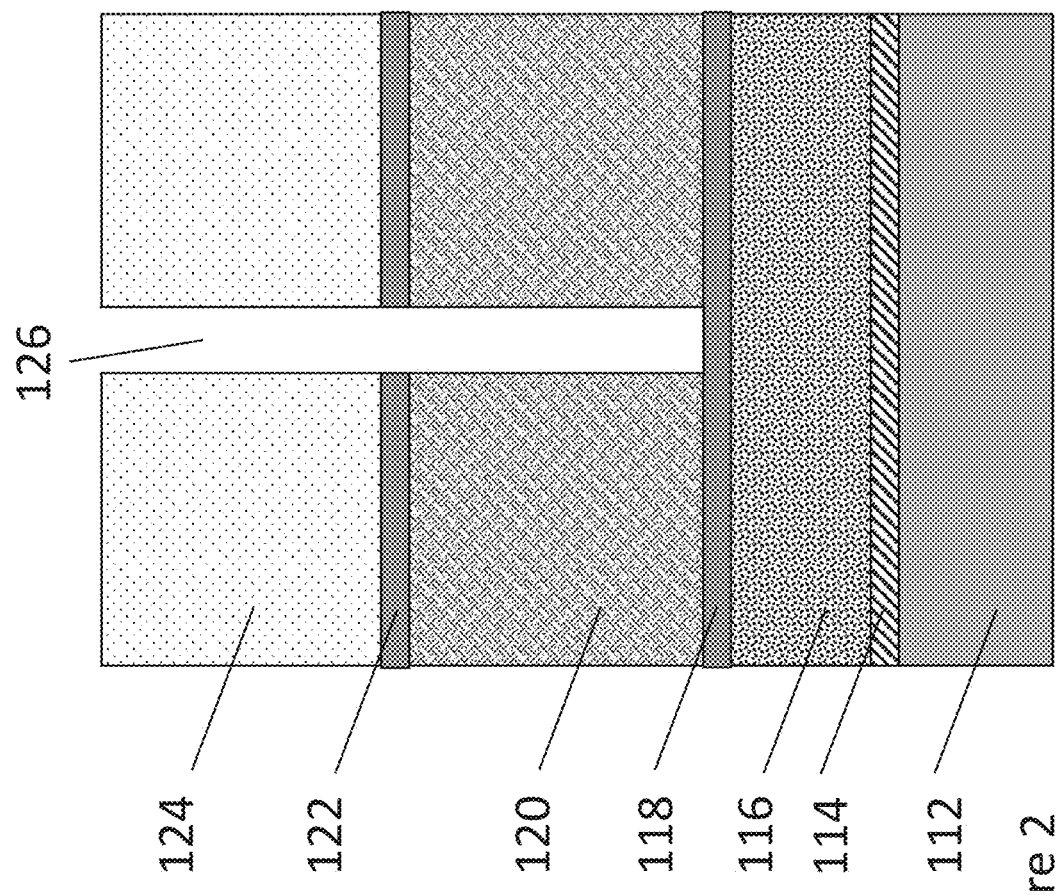
FIG. 2 is a cross-section view of the embodiment of the preliminary structure shown in FIG. 1 showing removed portions of certain layers of the stack to form a trench down to a bottom spacer layer.

FIG. 2 is a cross-section view of an embodiment of the preliminary structure 200 shown in FIG. 1 after removal of portions of certain layers (120, 122, 124) to form a trench 126 down to the bottom spacer layer 118.

An etch process, such as, for example, an anisotropic etch process, including, but not limited to, a masked reactive ion etch (RIE) process selective to the material making the bottom spacer layer 118 (e.g. SiN), is performed to form trench 126 through the oxide layer 124, top spacer layer 122 and sacrificial layer 120. The bottom of the trench 126 is the surface of the bottom spacer layer 118.

Figure 3:
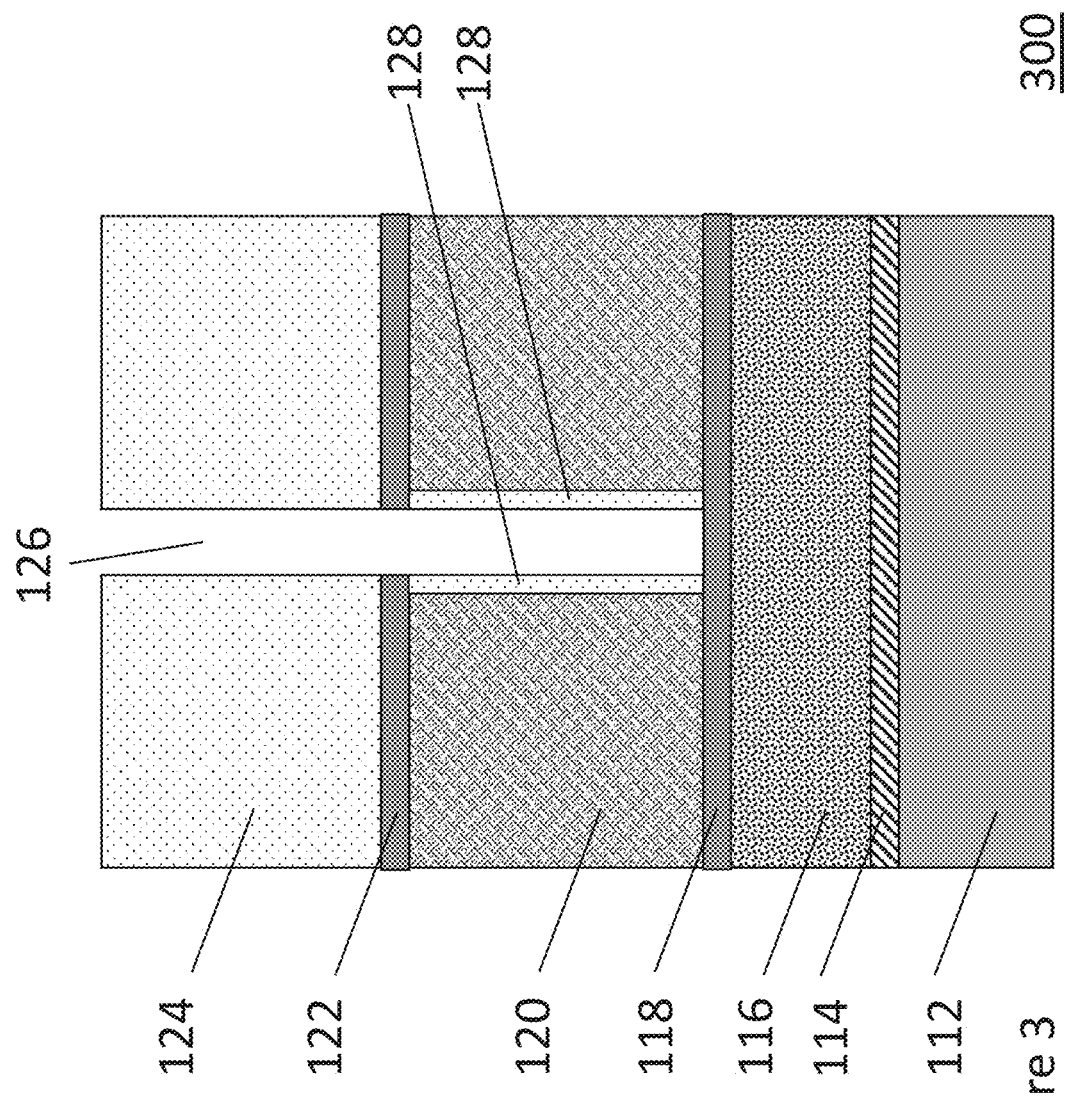
FIG. 3 is a cross-section view of the embodiment of a preliminary structure showing a vertical oxide layer formed on the sides of part of a sacrificial layer that is facing into the trench.

FIG. 3 is a cross-section view of an embodiment of a preliminary structure 300 showing a vertical oxide layer 128 formed on the sides of the part of the sacrificial layer 120 facing into and exposed by the trench 126.

A thin oxide 128 is formed on the surface of the sacrificial layer 120 exposed on the surface of the trench 126, between the top 122 and bottom 118 spacer layers. Plasma or another method of oxidation, may be used to form the thin oxide layer 128 on the exposed trench surfaces of the sacrificial layer 120. During subsequent growth of channel material (see 530, below), the oxide 128 prevents lateral growth of channel material, so that channel material 530 can be epitaxially grown in a bottom-up manner from the source/drain layer 116.

Figure 4:
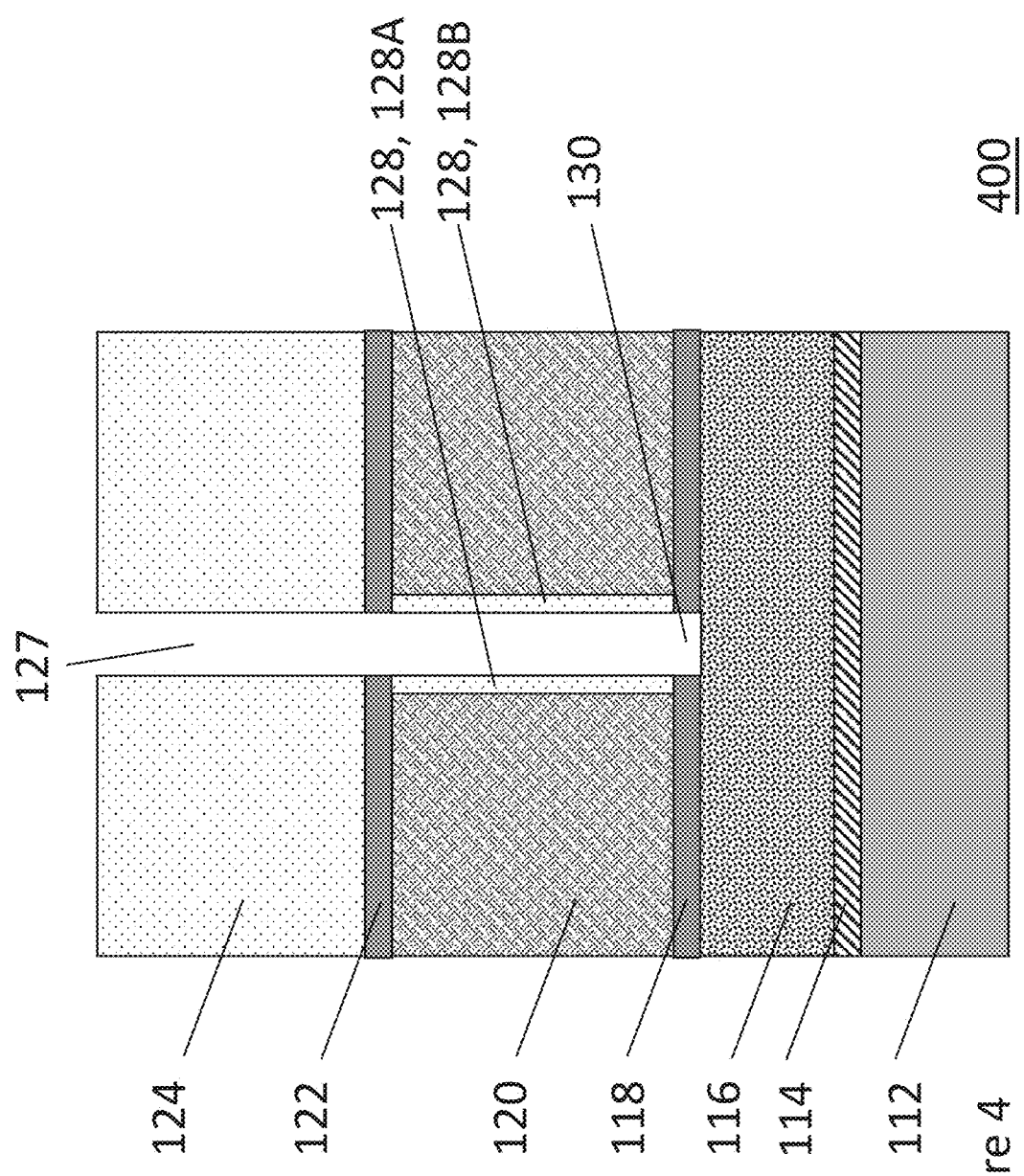
FIG. 4 is a cross-section view of the embodiment of a preliminary structure showing removal of a portion of the bottom spacer layer at the bottom of the trench to expose a source layer.

FIG. 4 is a cross-section view of an embodiment of a preliminary structure 400 showing removal of a portion 130 of the bottom spacer layer 118 at the bottom of the trench 126 to expose the source layer 116 at the trench bottom.

Following the formation of the oxide 128, the trench 126 is further etched, using, for example, a RIE process. The etching process punches through the bottom spacer 118 and selectively stops at the material in the heavily doped source/drain layer 116 to form trench 127. Trench 127 is deeper than trench 126 and is a self-aligned trench 127 open to the exposed S/D layer 116 at the trench 127 bottom.

Figure 5:
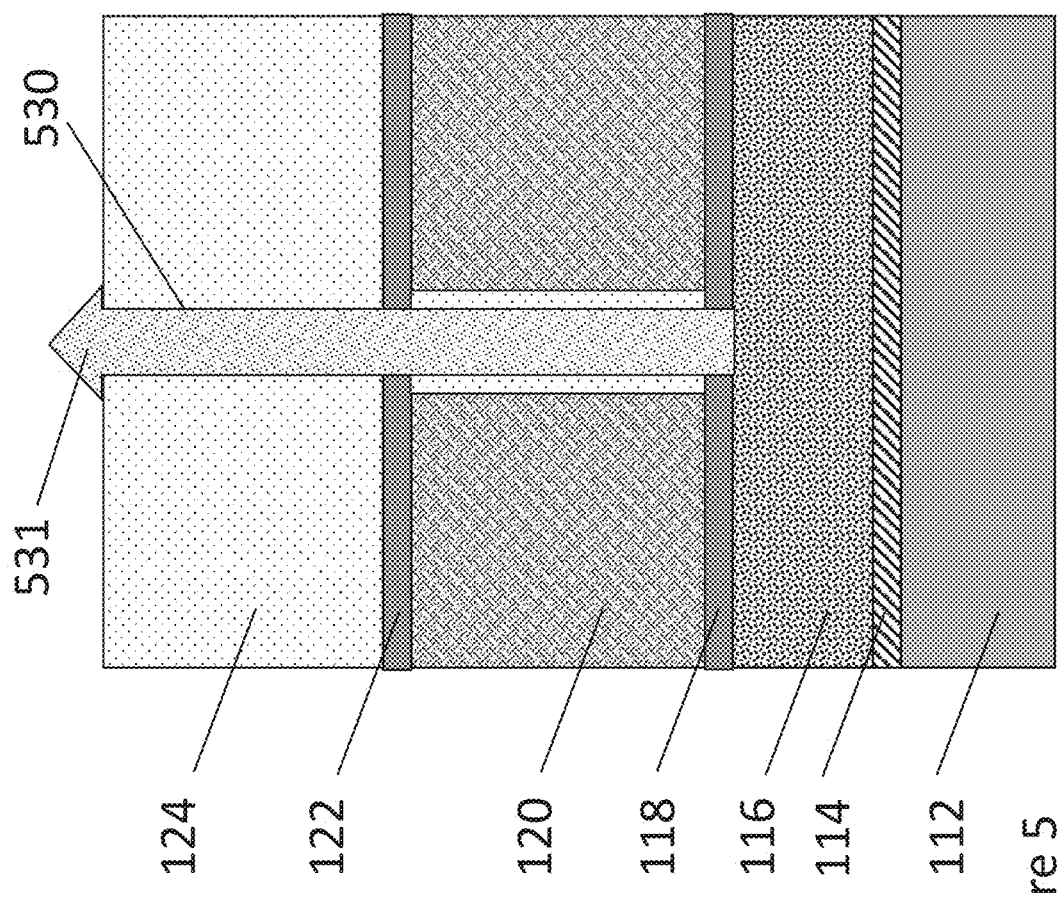
FIG. 5 is a cross-section view of the embodiment of a preliminary structure showing an epitaxial growth of a channel region within the trench.

FIG. 5 is a cross-section view of an embodiment of a preliminary structure 500 showing an epitaxial growth of a channel region 530 on the S/D layer 116 within the trench 127.

The channel 530 material can include, but is not necessarily limited to, silicon (Si), silicon germanium (SiGe), or other semiconductor material. An overgrowth 531 of the channel 530 material may form above the top surface of the oxide layer 124 during the epitaxial growth process.

Figure 6:
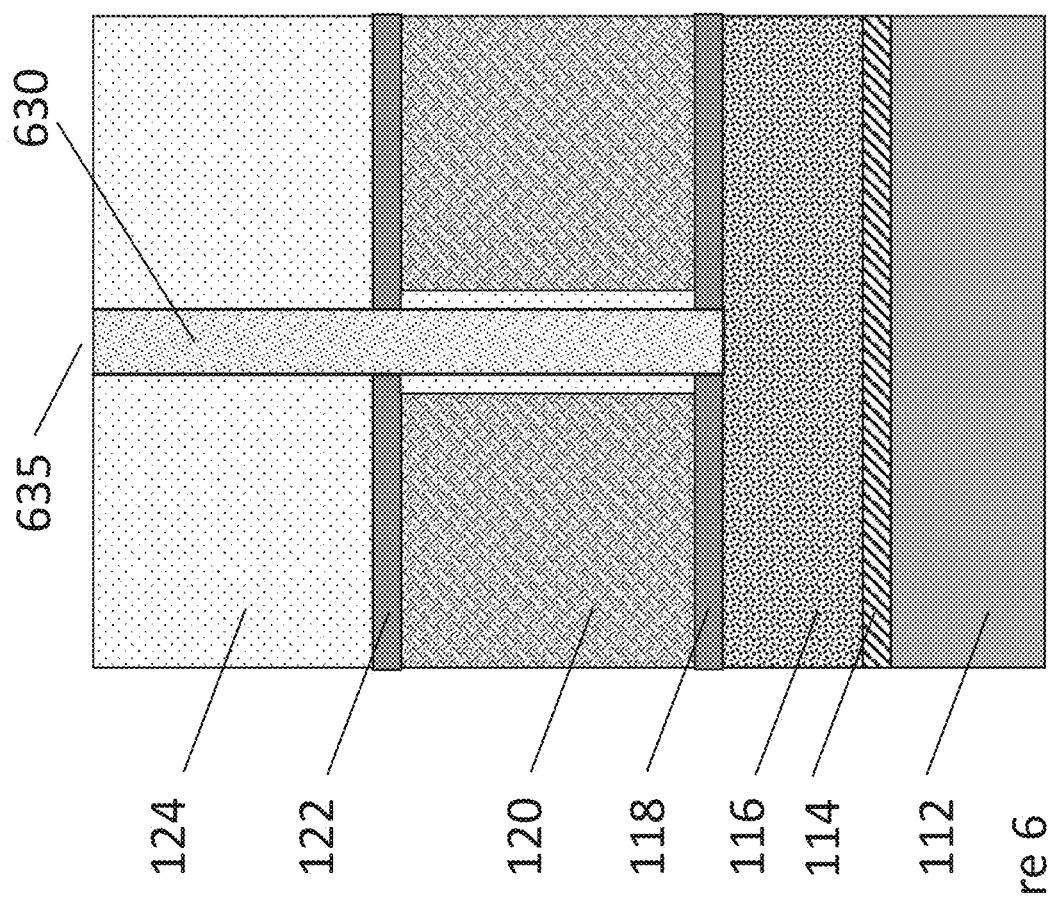
FIG. 6 is a cross-section view of the embodiment of a preliminary structure showing a polishing of an epitaxial overgrowth of the channel region.

FIG. 6 is a cross-section view of the embodiment of a preliminary structure 600 showing a polishing 635 of the epitaxial overgrowth 531 of the (polished) channel region 630. The overgrowth 531 may be removed 635 by polishing the surface back to the oxide layer 124 using, for example, chemical mechanical planarization (CMP).

Figure 7:
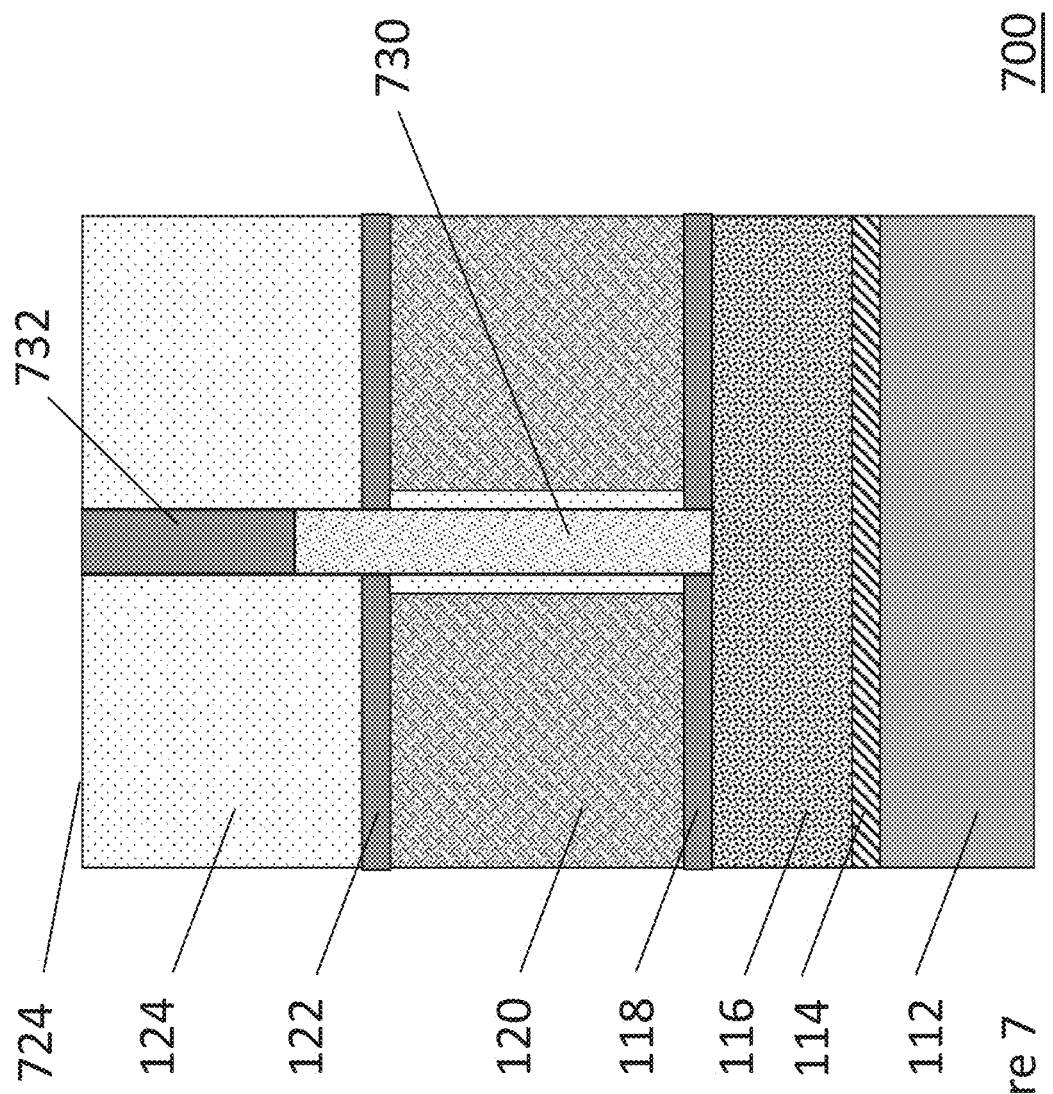
FIG. 7 is a cross-section view of the embodiment of a preliminary structure after removing a top portion of the channel region, filling the top portion space with a protective material (e.g. a nitride), and performing a chemical/mechanical polishing (CMP) to remove the excess protective material from the surface.

FIG. 7 is a cross-section view of the embodiment of a preliminary structure 700 after removing a top portion of the channel region 730, filling the top portion space with a protective material 732, and performing a chemical/mechanical polishing (CMP) to remove the excess protective material 732 on the surface 724 of the oxide layer 124.

A top portion (not shown) of the epitaxial channel material 730 is recessed into the oxide layer 124 in the trench 127. Recessing is performed to a level in the oxide layer 124 above the top spacer 122 using, an etching process, such as for example, a directional RIE, a wet etch, or a combination of both. The vacant portion (not shown) left by the recess is filled with a protective dielectric material 732, such as, a nitride layer 732, including, but not necessarily limited to, a nitride, SiN, SiBCN and/or SiOCN. The protective material layer 732 is formed by deposition techniques including, but not limited to, CVD, PECVD, RFCVD, PVD, ALD, MLD, MBD, PLD, LSMCD, and/or sputtering. Any excess nitride formed above the top surface 724 of oxide 124 is removed utilizing a planarization process, such as CMP, for example.

In some embodiments, the protective dielectric material 732 is SiN.

Figure 8:
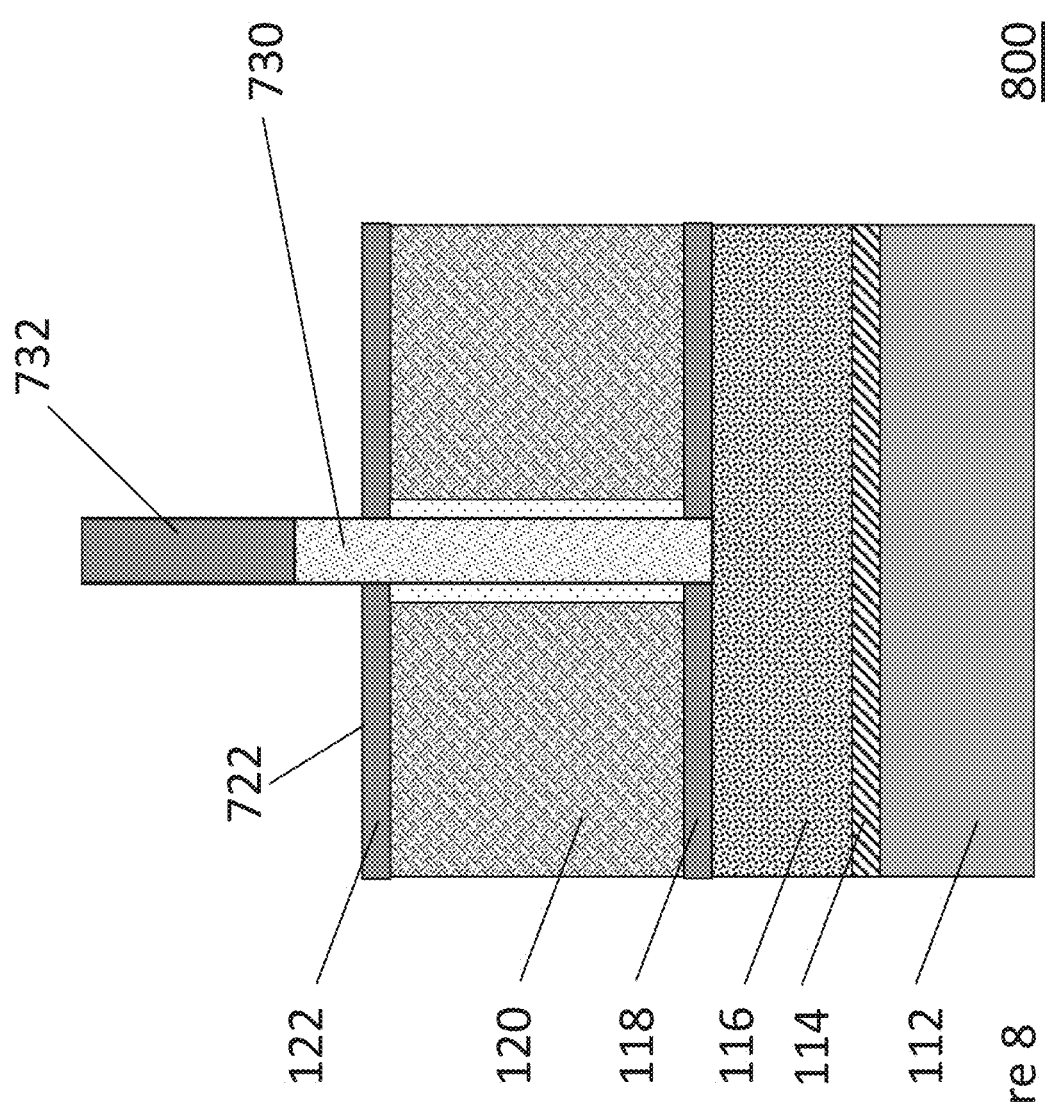
FIG. 8 is a cross-section view of the embodiment of a preliminary structure after removal of a top layer to expose the protective material and part of the channel region.

FIG. 8 is a cross-section view of the embodiment of a preliminary structure 800 after removal of a top layer 124 that exposes the protective material layer 732 and part of the channel region 730.

The oxide layer 124 removal exposes the top surface 722 of the top spacer layer 122, as well as side portions of the protective material layer 732 and part of the channel 730 above the top surface 722 of top spacer layer 122. An etch process selectively removes the oxide layer 124 from the protective material layer 732 and channel region 730 (partially) down to the surface 722 of the top spacer layer 122. The etch process can include, but is not necessarily limited to, directional RIE, wet etch, or a combination of both.

Figure 9:
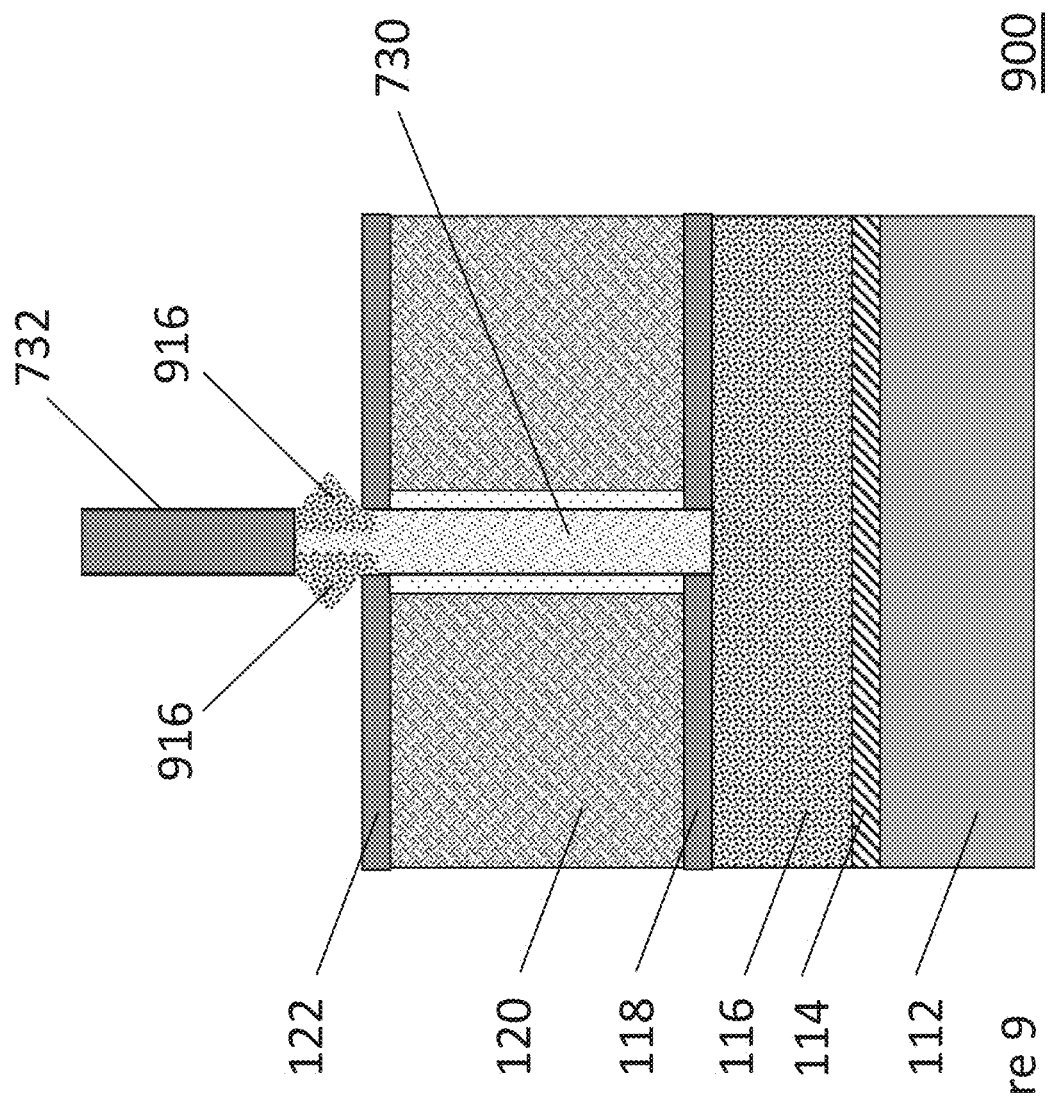
FIG. 9 is a cross-section view of the embodiment of a preliminary structure after growing a top source/drain (S/D) region.

FIG. 9 is a cross-section view of the embodiment of a preliminary structure 900 after growing a top source/drain (S/D) region 916. Following the removal of oxide layer 124, a top source/drain region 916 is formed on a top portion of channel 730 by epitaxial growth using selective epitaxy techniques described above.

Figure 10:
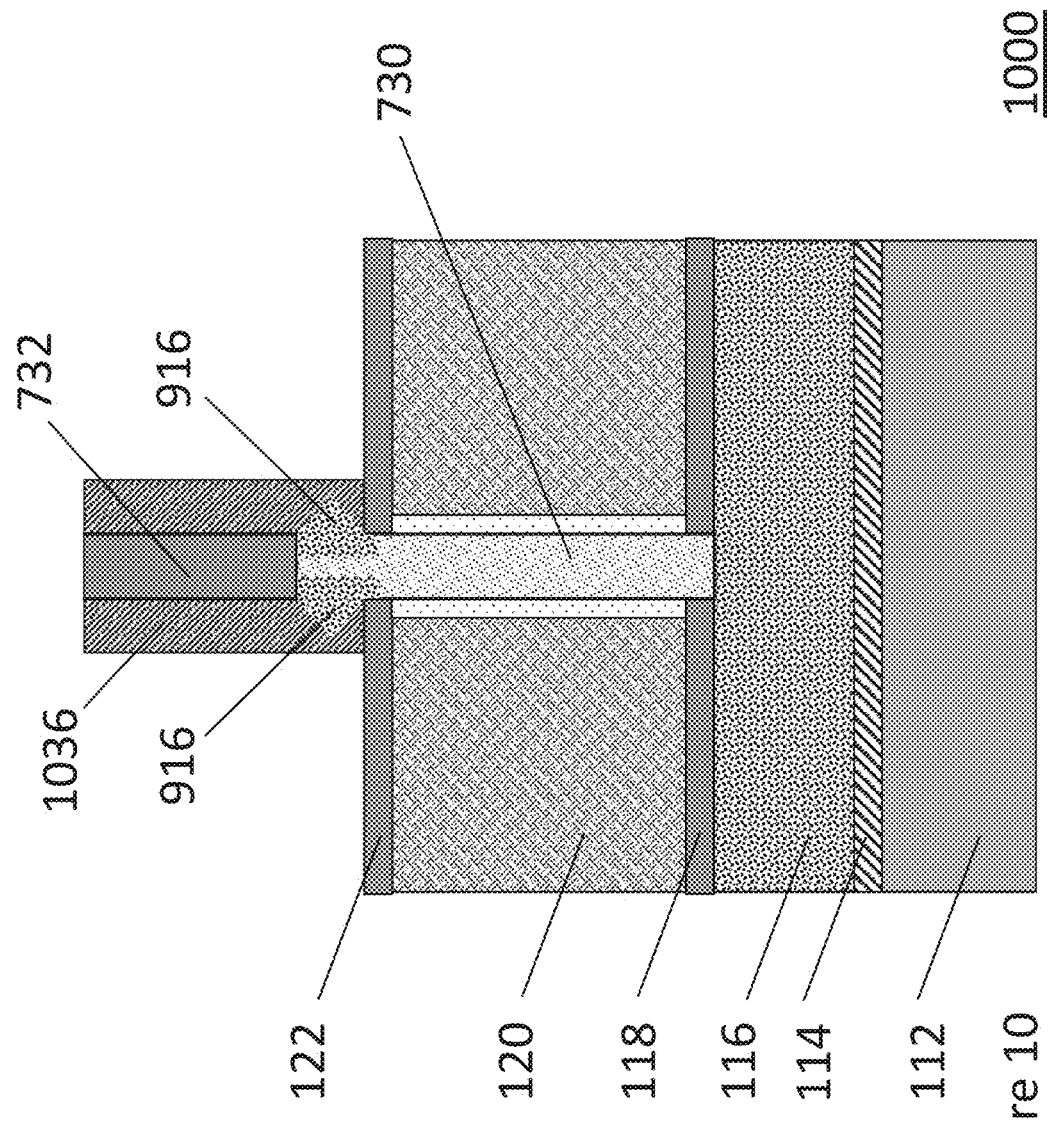
FIG. 10 is a cross-section view of the embodiment of a preliminary structure after formation of a protective spacer, protecting the top S/D region.

FIG. 10 is a cross-section view of the embodiment of a preliminary structure 1000 after formation of a protective spacer 1036 that surrounds the top S/D region 916 and the protective material 732.

The protective spacer 1036 is made from materials including, but not necessarily limited to, SiN, SiBCN and/or SiOCN, and is formed on the top spacer layer 122 and around the top source/drain region 916 and protective material layer 732. The protective spacer 1036 protects the top source/drain region 916 and sometimes acts as a mask during subsequent etching steps, as described below. The protective spacer 1036 is deposited using, for example, directional deposition techniques, including, but not necessarily limited to a CVD or PVD nitride deposition followed by spacer etch.

Figure 11:
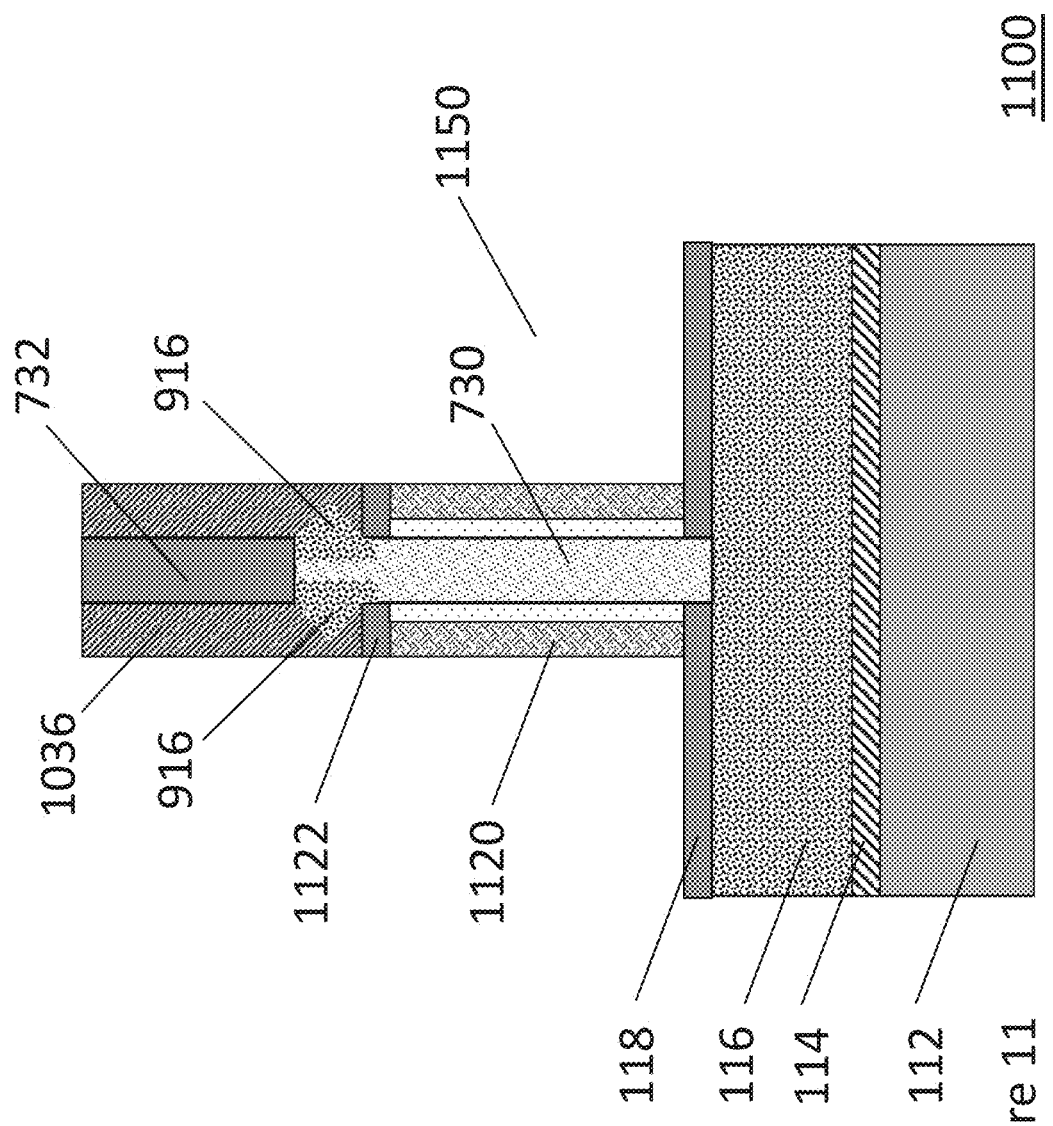
FIG. 11 is a cross-section view of the embodiment of a preliminary structure after removal of portions of the layers not protected/masked by the protective spacer, with a partially exposed bottom spacer.

FIG. 11 is a cross-section view of an embodiment of the preliminary structure after removal of portions of the layers not protected/masked by the protective spacer 1036. The protective spacer 1036 acts to mask the etch. The surface of the bottom spacer 118 not masked by the protective spacer 1036 is exposed. In some embodiments, a RIE removes portions of the top spacer 122 and sacrificial material 120 not masked by the protective spacer 1036. Parts of the sacrificial material 1120 and the parts of the top spacer 1122 that are masked by the protective spacer 1036 remain.

Figure 12:
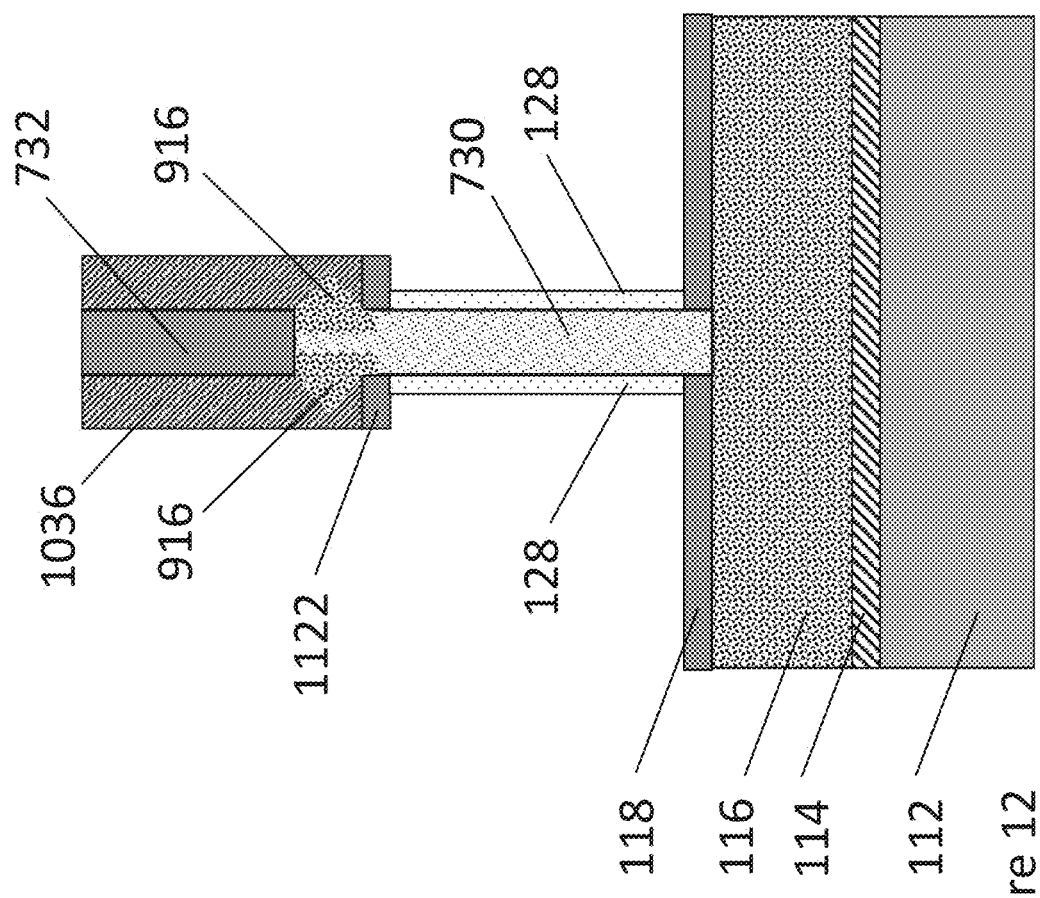
FIG. 12 is a cross-section view of the embodiment of a preliminary structure after removal of the remaining sacrificial material layer, with vertical oxide layers exposed.

FIG. 12 is a cross-section view of the embodiment of a preliminary structure 1200 after removal of the remaining sacrificial material layer 1120. Removal of the sacrificial material 1120 exposes the vertical oxide layers 128.

In some embodiments, the remaining sacrificial material 1120 is selectively removed by a dry etch or exposure to ammonium hydroxide (NH$_4$OH) at higher than room temperature. Alternatively, the remaining sacrificial material 1120 can be removed using a solution of hydrofluoric acid (HF) or dry chemical oxide etch. Methods and chemistries chosen to remove the remainder of the sacrificial material 1120 are chosen to have no effect on the materials making the remaining top spacer 1122, the vertical oxide layers 128, and the bottom spacer layer 118.

Figure 13:
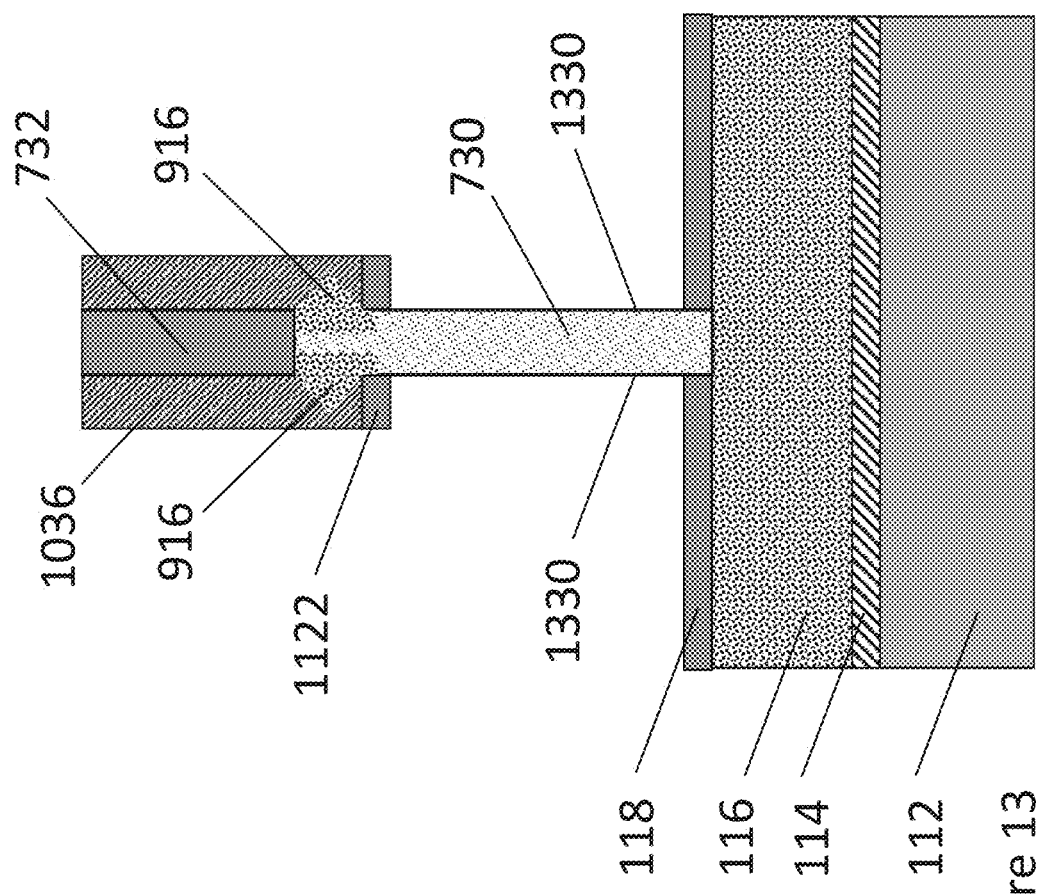
FIG. 13 is a cross-section view of the embodiment of a preliminary structure after removal of the vertical oxide layers and with side walls of the channel region between the top and bottom spacer layers exposed.

FIG. 13 is a cross-section view of the embodiment of a preliminary structure 1300 after removal of the vertical oxide layers 128 and exposure of the aggregate of the side wall surfaces 1330 of the channel region 730 between the (remaining) top 1122 and bottom 118 spacer layers.

Following the etching process that removes the remainder of the sacrificial material 1120, another etching process selectively removes the vertical oxide layers 128.

The vertical oxide layers 128 on the channel sidewall surfaces 1330 can be removed using, for example, a SiCoNi epitaxial pre-cleaning process performed prior to gate-on-channel epitaxy described in connection with FIG. 14, below. A SiCoNi pre-clean can include a plasma-based cleaning chemistry to gently remove oxide 128 at temperatures, for example, less than about 130° C. The SiCoNi pre-clean can include simultaneous exposure to H$_2$, NF$_3$ and NH$_3$ plasma by-products. The SiCoNi pre-clean process is largely conformal and selective towards silicon oxide layers but does not readily etch silicon regardless of whether the silicon is amorphous, crystalline or polycrystalline. Accordingly, the process does not remove material from the channel region 730 or the top 1122 and bottom 118 spacer layers.

Figure 14:
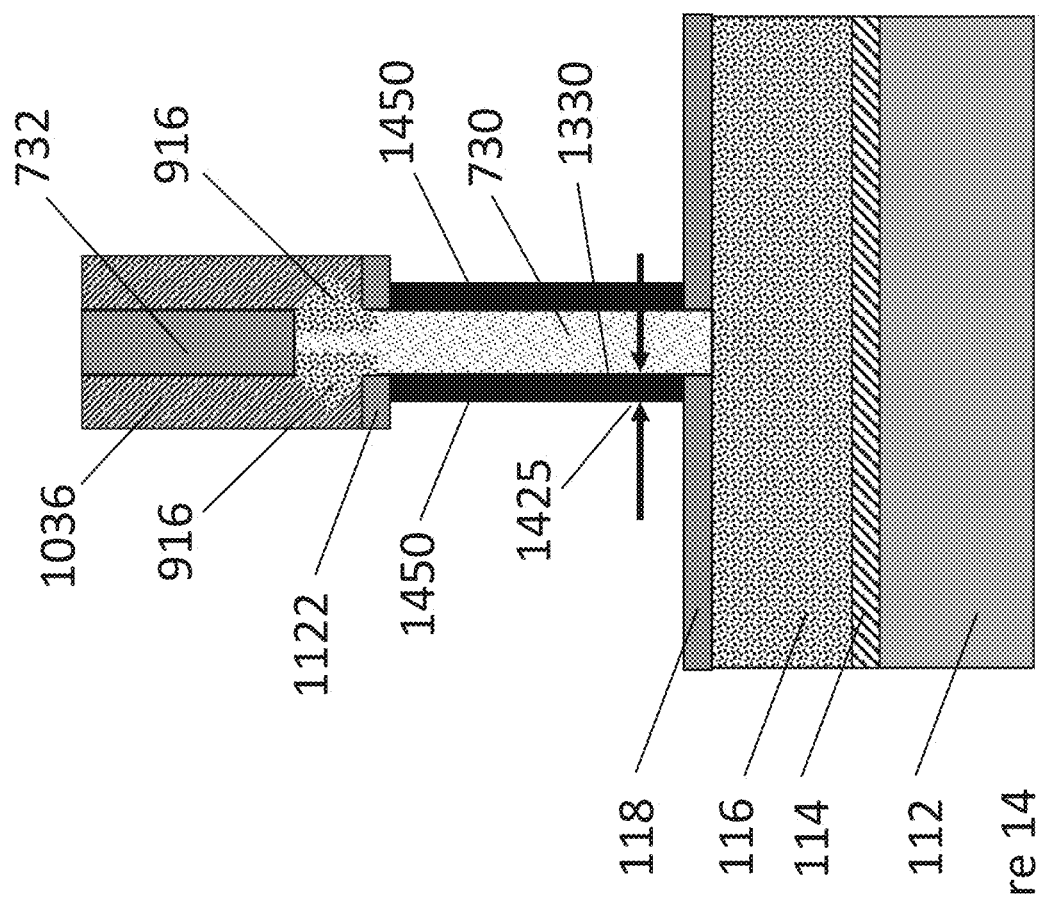
FIG. 14 is a cross-section view of the embodiment of a preliminary structure after formation of a gate region on the exposed side walls of the channel region.

FIG. 14 is a cross-section view of the embodiment of a preliminary structure 1400 after formation of a gate region 1450 on the exposed sidewall surfaces 1330 of the channel region 730. Depending on the embodiment, the gate region 1450 can be formed on one, two, three, or all the exposed side wall surfaces 1330 of the channel region 730. In some embodiments, all side wall surfaces 1330 of the channel region 730 are exposed and therefore the gate region 1450 is grown on all side wall surfaces 1330 of the channel region 730—in other words the gate region is grown "gate-all-around" the channel region 730.

During operation and upon applying a bias voltage to the "all-around" gate region 1450, the structure enables a depletion region within the channel 730 to grow (and shrink) from each of the sides of the channel region 730, thereby reducing the bias voltage range required to modulate the depletion region width within the channel region 730. This enables lower operation voltage/power, higher gain, and improved device electrostatics including steeper subthreshold slope and lower off-current.

Since the channel region (530, 730) is made of a semiconductor material (as described above), the gate region 1450 can be formed on the channel 730 by an epitaxy process (previously described), where a highly doped semiconductor material forming the gate is epitaxially grown onto one or more of the outer surface(s) 1330 of the channel region 730. In alternative embodiments, dual- or tri-gate structures can be formed as an alternative to all-around gates by choosing to grow (or preventing growth) of gate region 1450 on one or multiple sides of the channel 730.

The epitaxially grown gate region 1450 can be in-situ doped during epitaxial growth processes, and dopants may include, for example, an n-type dopant selected from a group V element hydride including, but not limited to, arsine (AsH$_3$), and phosphine (PH$_3$). Alternatively, a p-type dopant is selected from a group III element hydride, including, but not limited to, diborane and trimethylborane (TMB) gas at various concentrations. For example, in a non-limiting example, a dopant concentration range may be $10^{19}$/cm$^3$ to $10^{20}$/cm$^3$. The gate region 1450 can be made from materials including, but is not limited to, silicon (Si), silicon germanium (SiGe), or other semiconductor material.

In some embodiments, the doping of the gate region 1450 will be a higher concentration than and an opposite doping type than the doping of the channel 730. Accordingly, vertical p-n junctions are formed at each channel 730 surface 1330 on which the gate 1450 is grown. For instance, the channel region 730, as well as the source/drain regions 916 (upper S/D) and 116 (lower S/D), are doped with a first type doping, which may be either a p-type doping or an n-type doping. The channel 730 is doped with the same first type doping as the S/D's (116, 916) but with a lower dopant concentration. The gate region 1450 is doped with a second type doping, which may be either an n-type doping or a p-type doping, opposite to the doping of the channel region 730 and the source/drain regions 116 (lower S/D) and 916 (upper S/D). A p-n junction between the gate and the channel is thereby formed where there is an interface between one or more of the channel sides 1330 and the gate 1450. In contrast, the junction formed between source/drain regions 116 (lower S/D) and channel region 730, and the junction formed between source/drain regions 916 (lower S/D) and channel region 730, are ohmic junctions. In one embodiment, a p-channel junction FET is formed when the channel 730, source 116, and drain 916 are p-type doped and the gate 1450 is n-type doped. In another embodiment, an n-channel junction FET is formed when the channel 730, source 116, and drain 916 are n-type and the gate 1450 is p-type doped.

In addition, relative to each other in terms of concentration, in accordance with an embodiment of the present invention, the top 916 and bottom 116 source/drain regions can be more heavily doped than the gate region 1450, and the gate region 1450 can be more heavily doped than the channel region 730. For example, an embodiment of a resulting structure can have heavily doped (e.g., p++) source/drain regions 116 and 916, a highly doped (e.g., n+) gate region 1450, and a moderately doped (e.g., p) channel region 730.

It is noted that the top (what remains) 1122 and bottom 118 spacer layers prevent the growth of the gate region 1450 on the surface 1330 of the channel region 730 where there is an interface between channel 730 and either the top spacer 1122 layer or the bottom 118 spacer layer. As described below, in this embodiment, the top 1122 and bottom 118 spacers will permit creation of an external connection/extension to the gate region 1450. The external connection will electrically connect to the gate region 1450 though a surface interface with an interface area much less than the surface area of a gate 1450 region in contact with the total/aggregate channel sidewall surface 1330.

In addition, the thickness 1425 of the gate region 1450 is tightly controlled by the time and conditions at which the gate region 1450 epitaxially grows. In some embodiments, the gate region 1450 thickness 1425 is less than 10 nm. In other embodiments, the thickness 1425 is between 3 nm and 5 nm.

Different types of noise are generated within component parts of semiconductor circuits. Examples include "shot noise", "flicker noise", and noise produced from Auger. "Shot noise" or "Poisson noise" is a type of noise due to the discrete nature of charge carriers, e.g. the noise created because, at some very small level, current is measured as the aggregate of the Poisson distribution of the random flow of individual charge carriers. "Flicker noise" is produced for a variety of reasons including impurities in a conductive channel and generation and/or recombination of charge carriers. Noise is also created by Auger generation/recombination (Auger noise), a process where carriers are generated and/or recombined due to a three-particle transition.

The following are two regions where minority carrier generation-recombination occur and create noise in the JFET:

a. Generation-recombination at the metal-semiconductor junction or interface, e.g. between a metal/conductive external gate contact (shown in later figures, e.g. FIG. 23) and the highly doped (e.g. n+ doped) gate semiconductor 1450.

Noise created at the metal-gate semiconductor junction/interface can be reduced by reducing the area of the metal contact or interface at the gate semiconductor interface/junction because fewer minority carriers are generated when these interfaces/junctions have a smaller area.

b. Generated minority carriers within heavily doped semiconductors, e.g. minority carriers generated within the highly doped (e.g., n+) gate region (mainly due to Auger) can flow into the channel 730 and generate noise. The higher the (e.g. n+) doping and the thicker the n+ region, the higher the Auger generation.

The thinner 1425 and the less heavily-doped (n+) the gate 1450, the lower the potential barrier for the generated carriers to flow into the channel.

These conditions create a design tradeoff. Decreasing the thickness 1425 (and doping level) of the gate region 1450 decreases the rate of noise-creating generation-recombination of carriers within the gate region 1450. However, this results in a lower potential barrier generated by the presence of the gate region 1450 between the metal contact and the channel region, so more of the noise-creating generated carriers enter the channel 730. Stated another way, a thinner 1425 gate 1450 creates fewer noise-causing carriers from within the gate region 1450 but more of those carriers as well as those carriers generated at the metal contact/gate interface enter the channel 730 due to the lower potential barrier to the channel.

Figure 15:
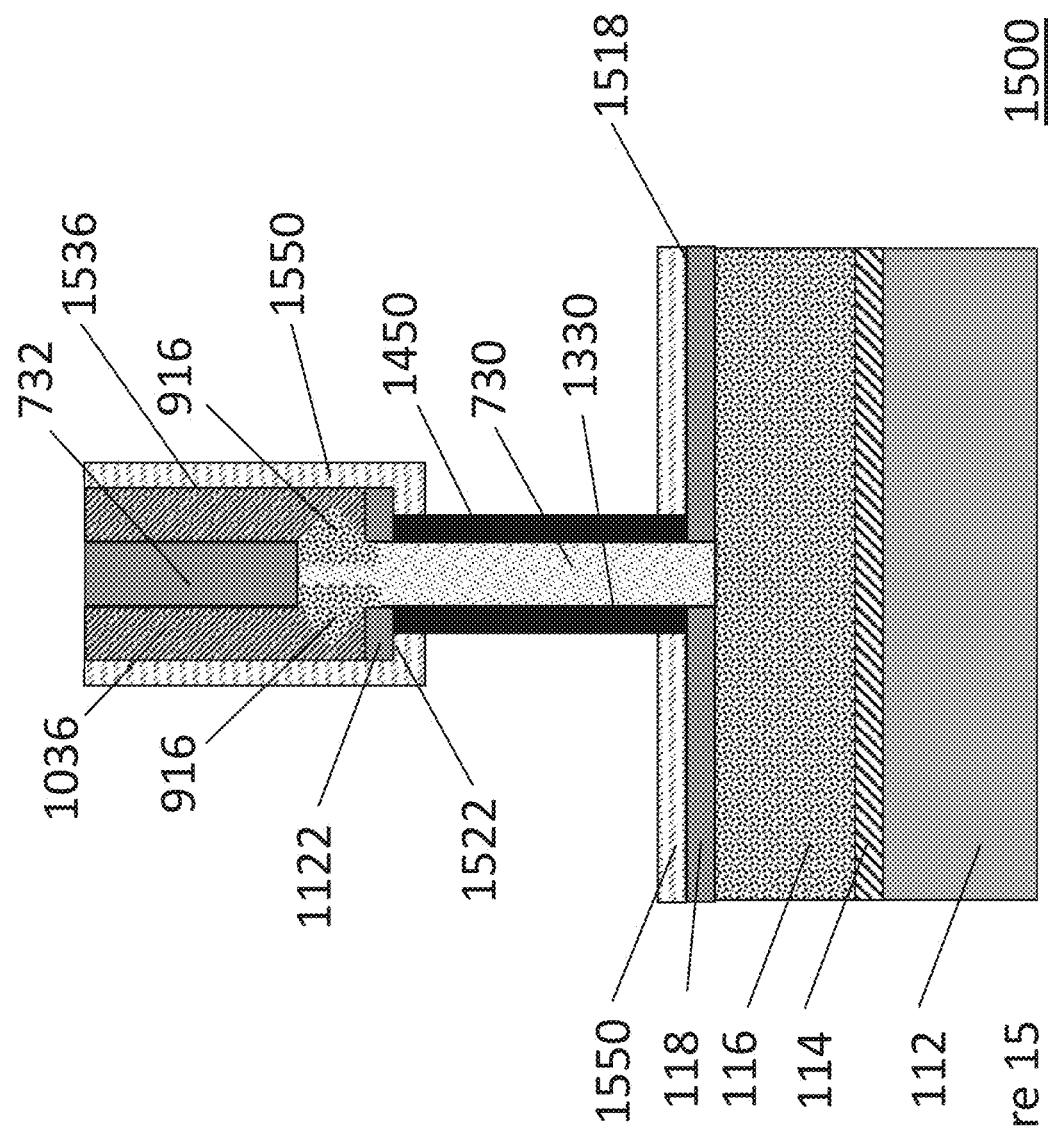
FIG. 15 is a cross-section view of the embodiment of a preliminary structure after a deposition of selective dielectric material only on dielectric surfaces.

FIG. 15 is a cross-section view of an embodiment of a preliminary structure 1500 after a deposition of selective dielectric material 1550. The selective dielectric material 1550 only deposits on dielectric surfaces. The selective dielectric material layer 1550 or interlayer dielectric (ILD) layer 1550 selectively deposits on some of the spaces/surfaces around the VJFET structure 1500, e.g. the surface 1518 above the bottom spacer 118, the surface 1522 below the remains of the top spacer layer 1122, and the side surfaces 1536 of the protective spacer 1036. The ILD layer 1550 does not adhere to or deposit on the surface of the gate region 1450, a semiconductor material.

The ILD layer 1550 can be deposited using standard deposition techniques including, but not limited to, CVD, PECVD, RFCVD, PVD, ALD, MLD, MBD, PLD, LSMCD, and/or sputtering, followed by planarization by, for example, CMP, down to the protective material layer 732. The ILD layer 1550 is made of materials including, but not necessarily limited to, silicon dioxide ($SiO_2$), low-temperature oxide (LTO), high-temperature oxide (HTO), field oxide (FOX) and/or other dielectric materials. Certain of the deposition methods, e.g. ALD, can accurately control the final thickness of the ILD layer 1550. The thickness range of the ILD layer 1550 depends on the channel 730 length. In some embodiments, the ILD layer 1550 thickness is between 4 nm and 10 nm, or between 4 nm and 6 nm. Other thicknesses are envisioned.

Figure 16:
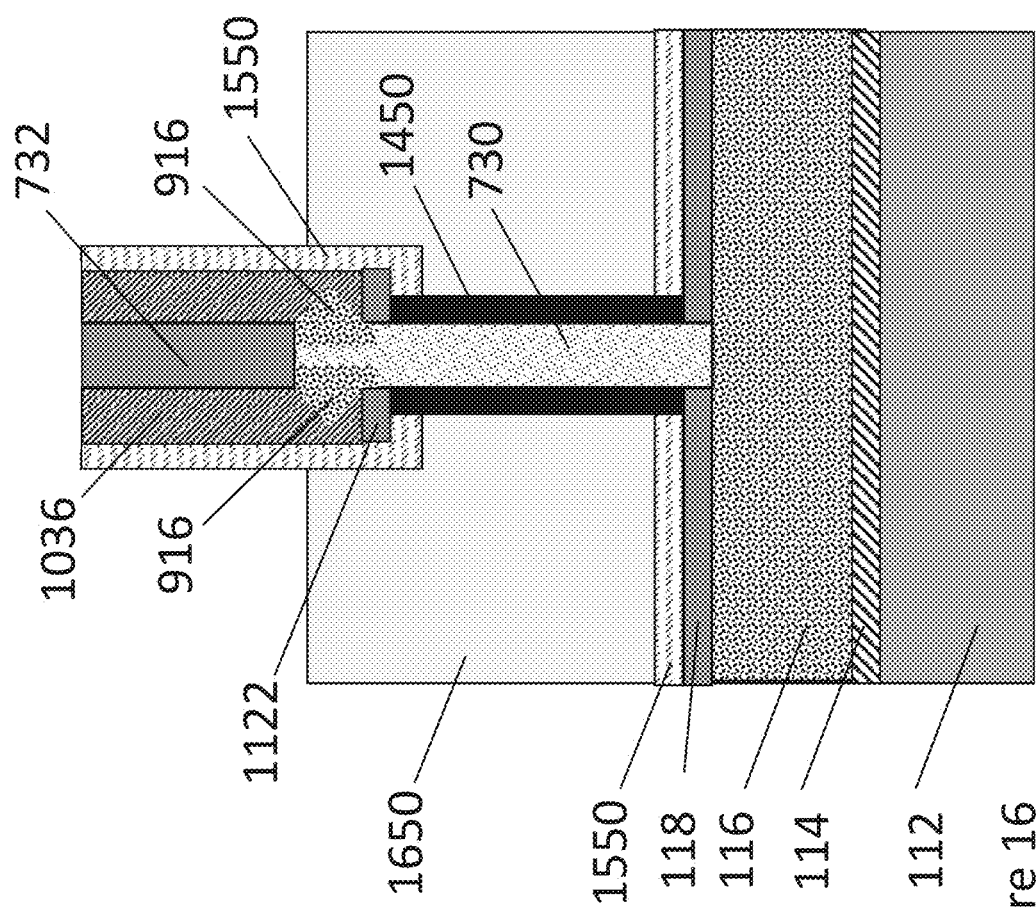
FIG. 16 is a cross-section view of the embodiment of a preliminary structure after deposition of a hard-mask dielectric.

FIG. 16 is a cross-section view of the embodiment of a preliminary structure 1600 after deposition of a hard-mask dielectric 1650, e.g. a nitride material. The hard-mask dielectric 1650 is made of a material that can be etched selectively separate from the ILD layer 1550 material, the protective material layer 732, and the top spacer 1122 material. Selective material selections are known. Hard-mask dielectric 1650 materials include but are not necessarily limited to, a nitride, such as, SiBCN, SiOCN, SiN or $SiO_2$(silicon dioxide), deposited using, for example, directional deposition techniques, including, but not necessarily limited to high density plasma (HDP) deposition and gas cluster ion beam (GCIB) deposition, or deposition techniques including, but not limited to, CVD, PECVD, RFCVD, PVD, ALD, MLD, MBD, PLD, LSMCD, and/or sputtering.

In some embodiments, the hard-mask dielectric 1650 is SiOC.

Figure 17:
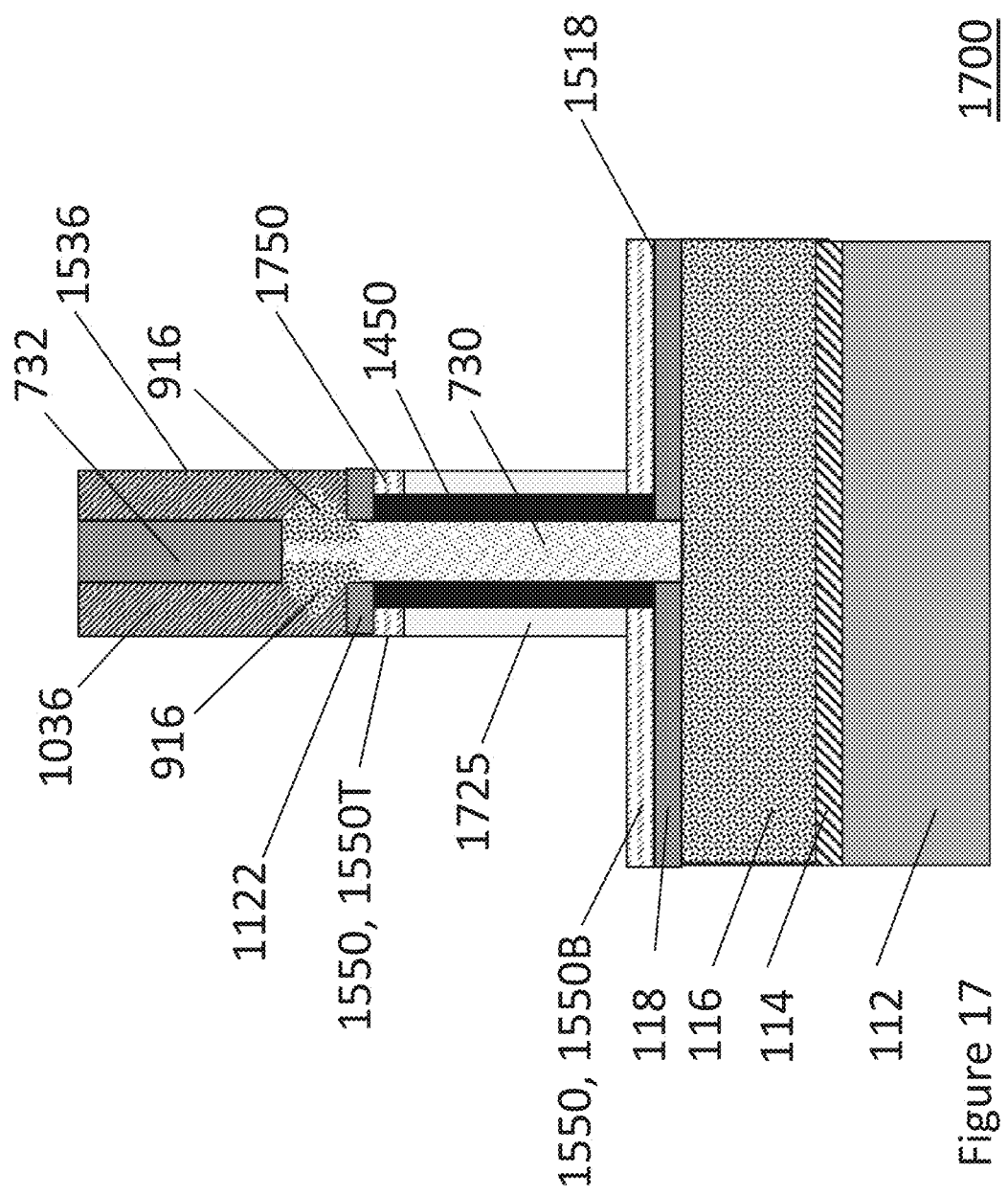
FIG. 17 is a cross-section view of the embodiment of a preliminary structure after a directional etching step removes the hard-mask dielectric and selective dielectric material in regions not masked/protected by the protective spacer.

FIG. 17 is a cross-section view of the embodiment of a preliminary structure 1700 after using known techniques, e.g. a directional etching step, to remove much of the hard-mask dielectric 1650 and selective dielectric material (ILD)1550 in regions not masked/protected by the protective spacer 1036. The ILD material 1550 is removed from the sides 1536 of the protective spacer 1036 but is retained (using etch stopping techniques) as a layer (1550, 1550B) on the surface 1518 of the bottom spacer 118 layer. In addition, vertical thicknesses of the hard mask 1725 material 1650 remain around the gate region 1450 and under portions 1750 of the ILD material 1550 that remain around the gate region 1450 and between vertical thicknesses of hard mask 1725 and the top spacer 1122 material.

Figure 18:
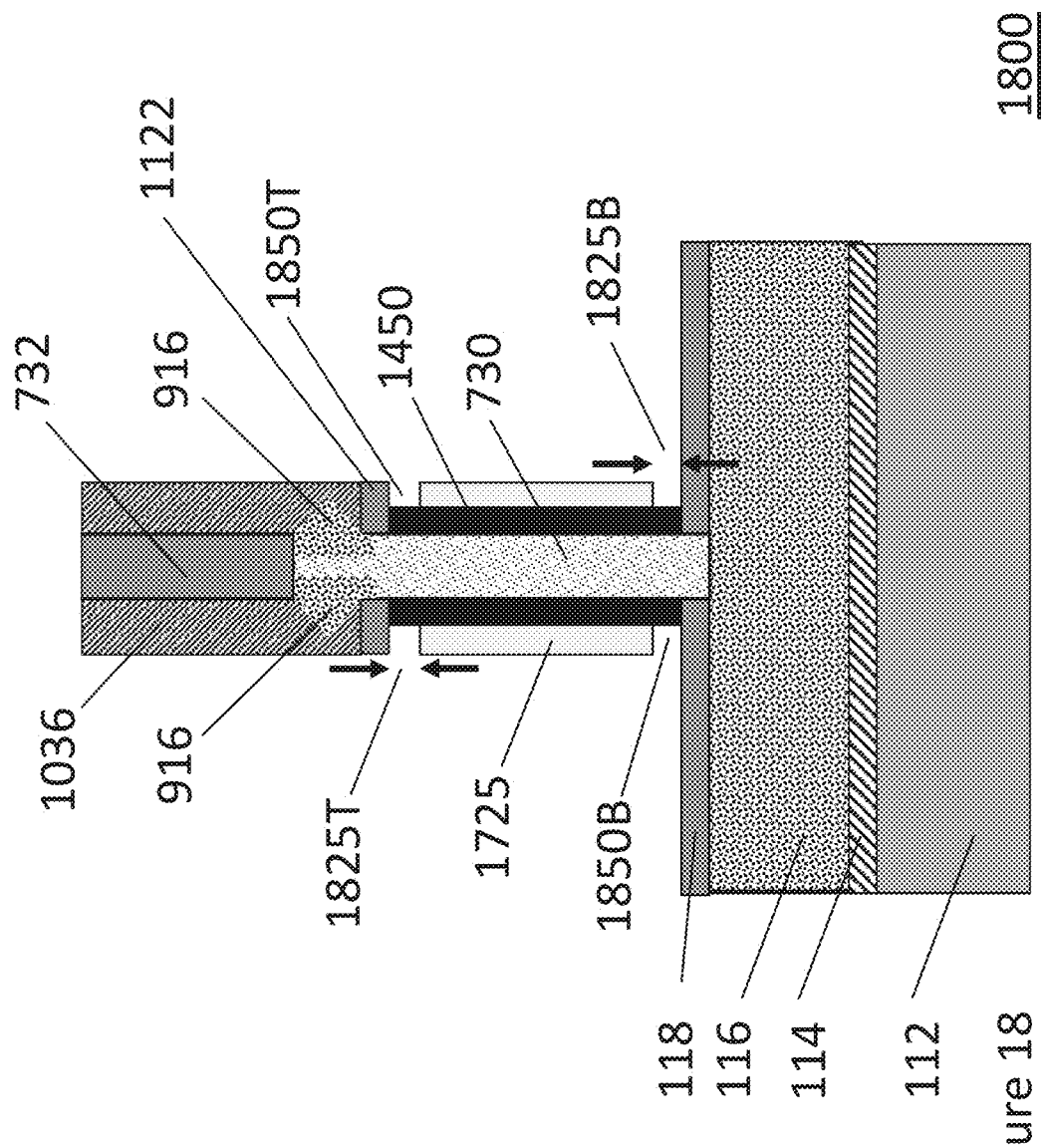
FIG. 18 is a cross-section view of the embodiment of a preliminary structure after removing the remaining selective dielectric material, creating a top gap and a bottom gap, and exposing a top part and a bottom part of the gate in the regions of the top gaps and bottom gaps, respectively.

FIG. 18 is a cross-section view of the embodiment of a preliminary structure 1800 after removing the remaining selective dielectric material (ILD) 1750, creating a top gap 1850T and a bottom 1850B gap, and exposing a top part and a bottom part of the gate 1450 in the regions of the top 1850T and bottom 1850B gaps, respectively. The top gap 1850T has a top gap thickness 1825T and the bottom gap 1850B has a bottom gap thickness 1825B.

The thicknesses 1825T and 1825B of the top 1850T and bottom 1850B gaps, respectively, is determined by the thickness of the IDL 1550 and, as stated above, can be accurately controlled by the deposition technique used, e.g. ALD. In some embodiments, the gap thicknesses (1825T, 1825B) are between 4 nm and 10 nm, or between 4 nm and 6 nm. Other thicknesses are envisioned.

As detailed further below, the top gap thickness 1825T and bottom gap thickness 1825B of determine the surface 1330 of the channel 730 exposed for connection to a conductive, e.g. metallic, external gate connection. As an example, the amount of channel sidewall surface 1330 exposed for an electrical connection and therefore the amount of surface forming a connection/gate junction or interface would be approximately equal to the gap thickness (1825T, 1825B) times the length of the gaps (e.g. into and out of the Figure and otherwise all around the gate). Accordingly, the area of the metal connection/gate interface/junction can be controlled by controlling the gap thicknesses (1825T, 1825B). By reducing the gap thicknesses (1825T, 1825B), the numbers of generated and re-combining carriers are reduced at this connection/gate interface/junction and so the noise produced at the junction is reduced.

Figure 19:
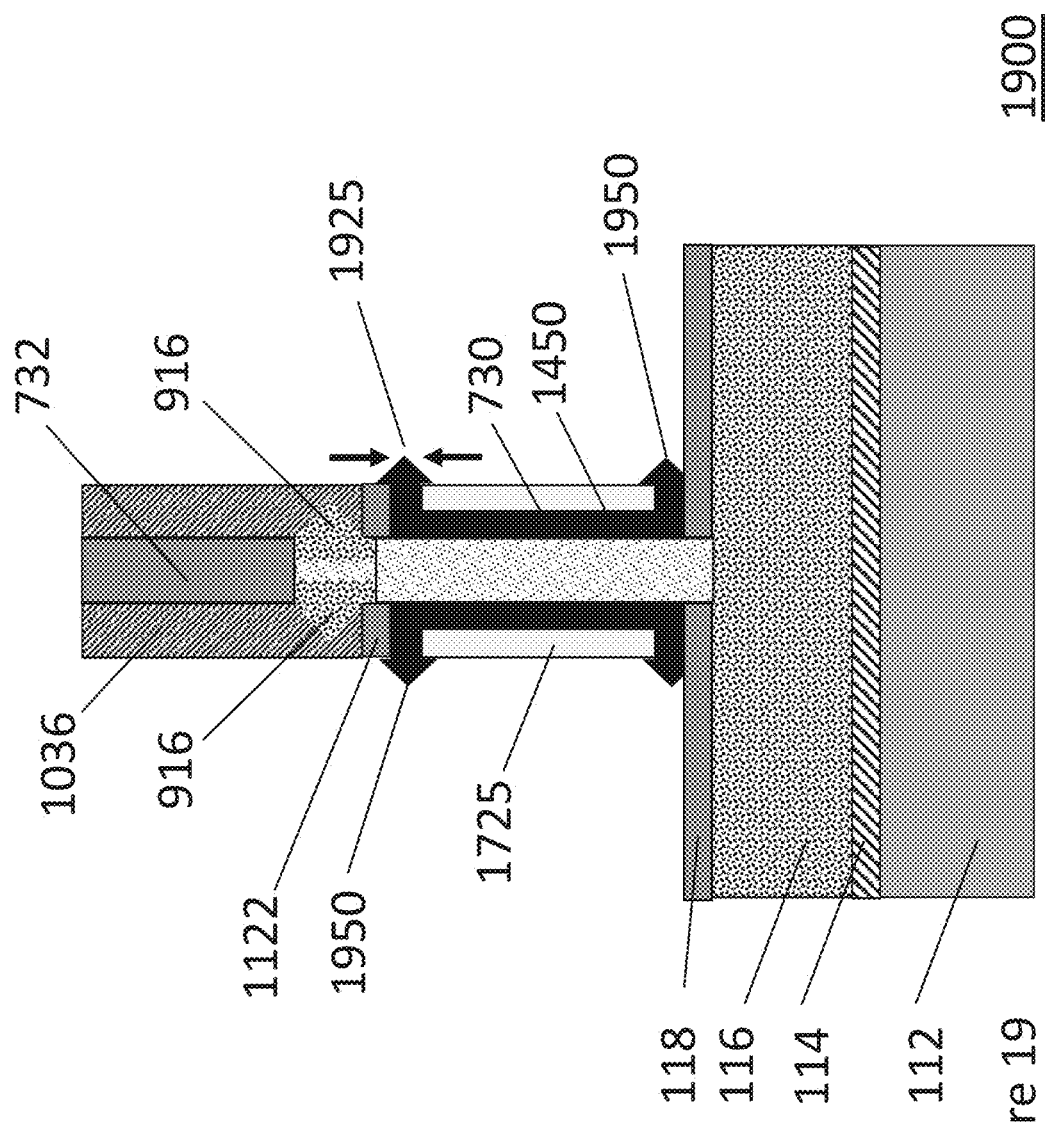
FIG. 19 is a cross-section view of the embodiment of a preliminary structure after an epitaxial growth of gate semiconductor material/extensions into the gaps.

FIG. 19 is a cross-section view of the embodiment of a preliminary structure 1900 after an epitaxial growth of gate semiconductor material/extension 1950 into the top gap 1850T and bottom gap 1850B creating a semiconductor gate extension 1950 in each of the gaps (1850T, 1850B).

The epitaxial growth is performed as described above. Because the growth of each gate extension 1950 is constrained by the vertical thicknesses of the hard mask 1725 material and either the top spacer 1122 (for the top gap 1850T) and the bottom spacer layer 118 (for the bottom gap 1850B), respectively, the gate extensions 1950 have a gate extension thickness 1925 equal to the gap thicknesses (1825T, 1825B) in which they reside. Again, the gate extension thickness 1925 is predetermined by the thickness of the controlled deposition of the selective dielectric material (ILD) 1550 layer.

The growth of each gate extension 1950 past the outward surface of the vertical thicknesses of the hard mask 1725 material is unconstrained. As indicated by the arrows at the ends of the gate extensions 1950 pointing away from the channel 730, these unconstrained surfaces of the gate extensions 1950 epitaxially grow to form crystalline planes according to the lattice structure of the gate extension 1950. For example, the unconstrained surfaces of the gate extensions 1950 can form a diamond shaped structure with <110> oriented planes bound by <111> oriented planes.

In some embodiments, the materials and doping of the gate extensions 1950 will be the same type and concentration as the doping of the gate region 1450.

Figure 20:
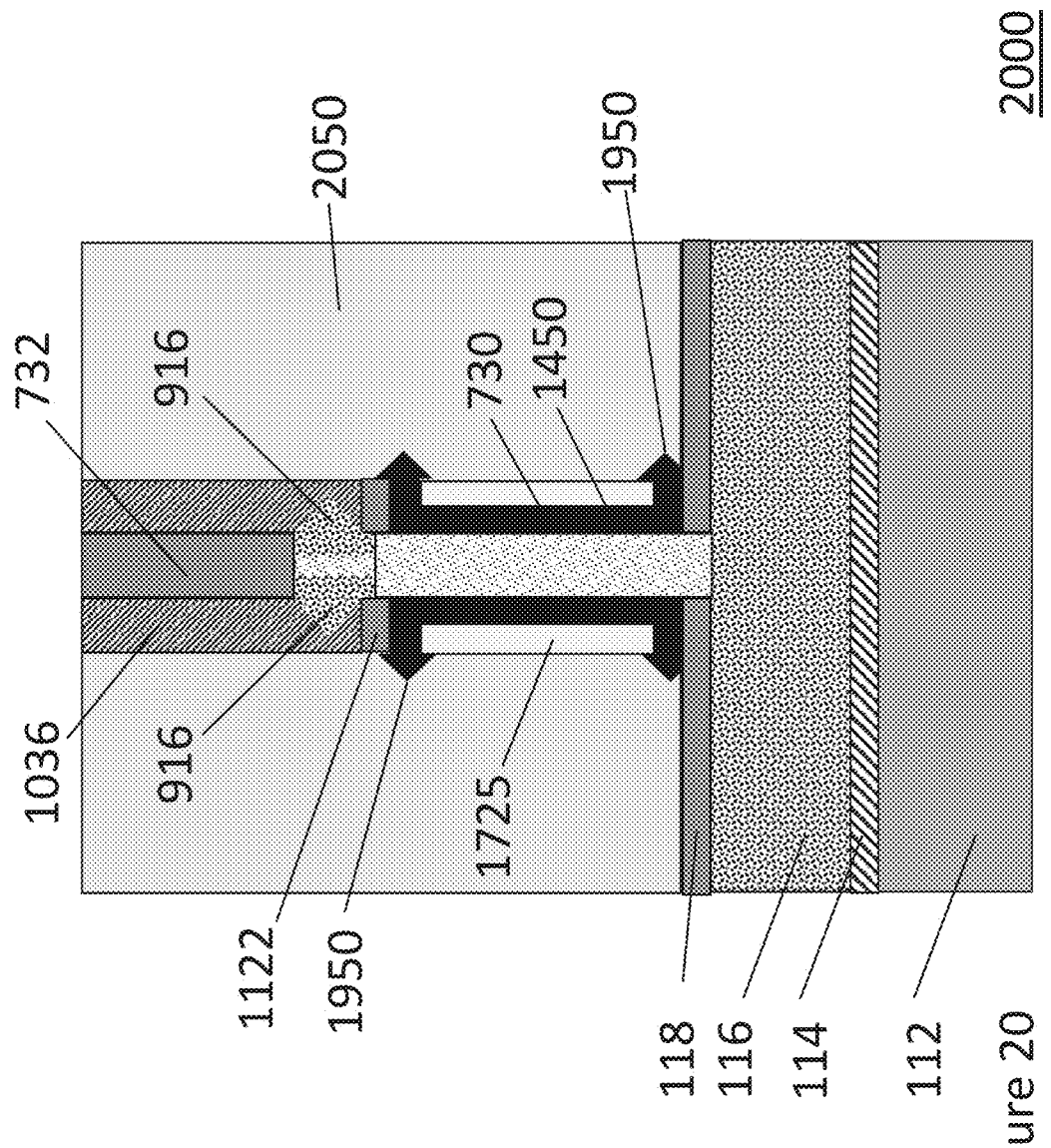
FIG. 20 is a cross-section view of the embodiment of a preliminary structure after an interlayer dielectric (ILD) deposition.

FIG. 20 is a cross-section view of the embodiment of a preliminary structure 2000 after a second interlayer dielectric (ILD) layer 2050 deposition. (Note that all the material 1550 deposited in the first ILD deposition, as disclosed in the description of FIG. 15, is now removed.)

The second ILD layer 2050 may be formed from, for example, a low-k dielectric material (with k<4.0), including but not limited to, silicon oxide, spin-on-glass, a flowable oxide, LTO, HTO, FOX, a high-density plasma oxide, borophosphosilicate glass (BPSG), or any combination thereof.

The ILD layer 2050 is deposited by a deposition process, including, but not limited to CVD, PVD, PECVD, ALD, evaporation, chemical solution deposition, or like processes. The second ILD layer 2050 covers the entire structure 2000 above the bottom spacer layer 118. A CMP planarization step can follow.

Figure 21:
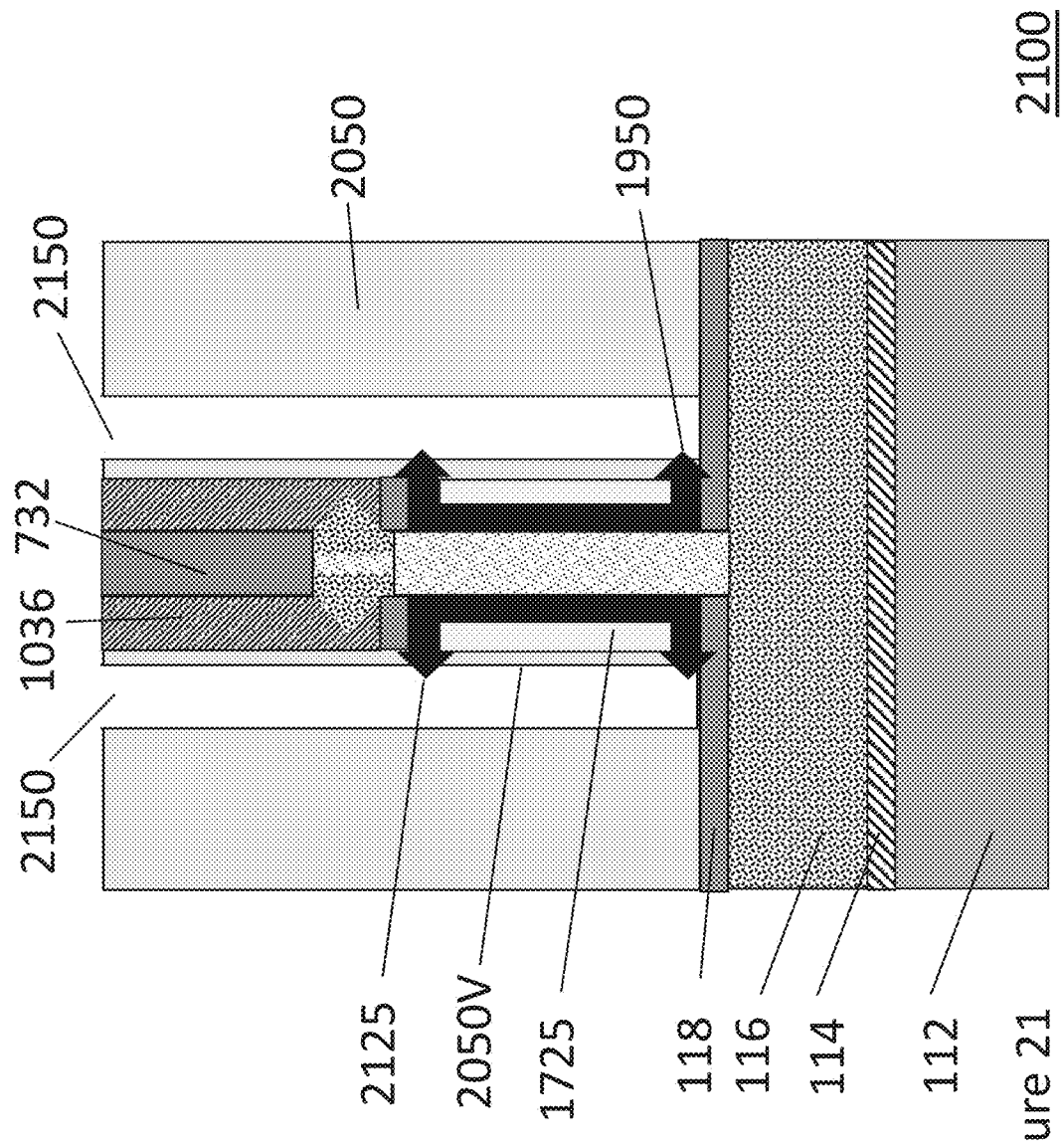
FIG. 21 is a cross-section view of the embodiment of a preliminary structure after gate contact vias are opened in the ILD.

FIG. 21 is a cross-section view of the embodiment of a preliminary structure 2100 after gate contact vias 2150 are opened in the ILD layer 2050.

The gate contact vias 2150 terminate at the surface of the bottom spacer layer 118 and are made using standard methods such as a patterned etch or laser cut.

Creation of the gate contact vias 2150 exposes a gate extension area 2125 of the unconstrained grown surfaces of the gate extensions 1950 facing into the gate contact vias 2150. Depending on the selectivity of the process that creates the gate contact vias 2150, the diamond/facetted shaped structure at the end of the gate extensions 1950 can remain intact or can be sheared off. If sheared off, the exposed gate extension area 2125 of the gate extension 1950 is the same as the cross-section of the respective gate extensions 1950. In either case, the exposed gate extension area 2125 is exposed to openings in the gate contact vias/trenches 2150.

It is noted that the gate extension area 2125 exposed in the via 2150 is a much smaller surface area than the aggregate/total area of the side wall surfaces 1330 of the channel region 730. Accordingly, the area of electrical contact to the gate region 1450 through the gate extension area 2125 by the external electrical connections, described below, is much less than if the external electrical connections were connected directly to the entire gate 1450 surface area 1330.

In some embodiments, the interface area 2125 is between 1 to 20 percent of the total side wall surface 1330.

In addition, the i. second ILD 2050 material 2050V between the upper and lower gate extensions 1950 and the ii. vertical thicknesses of the hard mask 1725 material electrically insulate most of the gate region 1450 (except the gate extensions 1850T/1850B) from any contact with the conductive material that will fill the gate contact vias 2150. These layers (1725 and 2050V) also fill the space between the upper 1950 and lower 1950 gate extensions caused by the thinner 1425 (less volume) gate region 1450.

Figure 22:
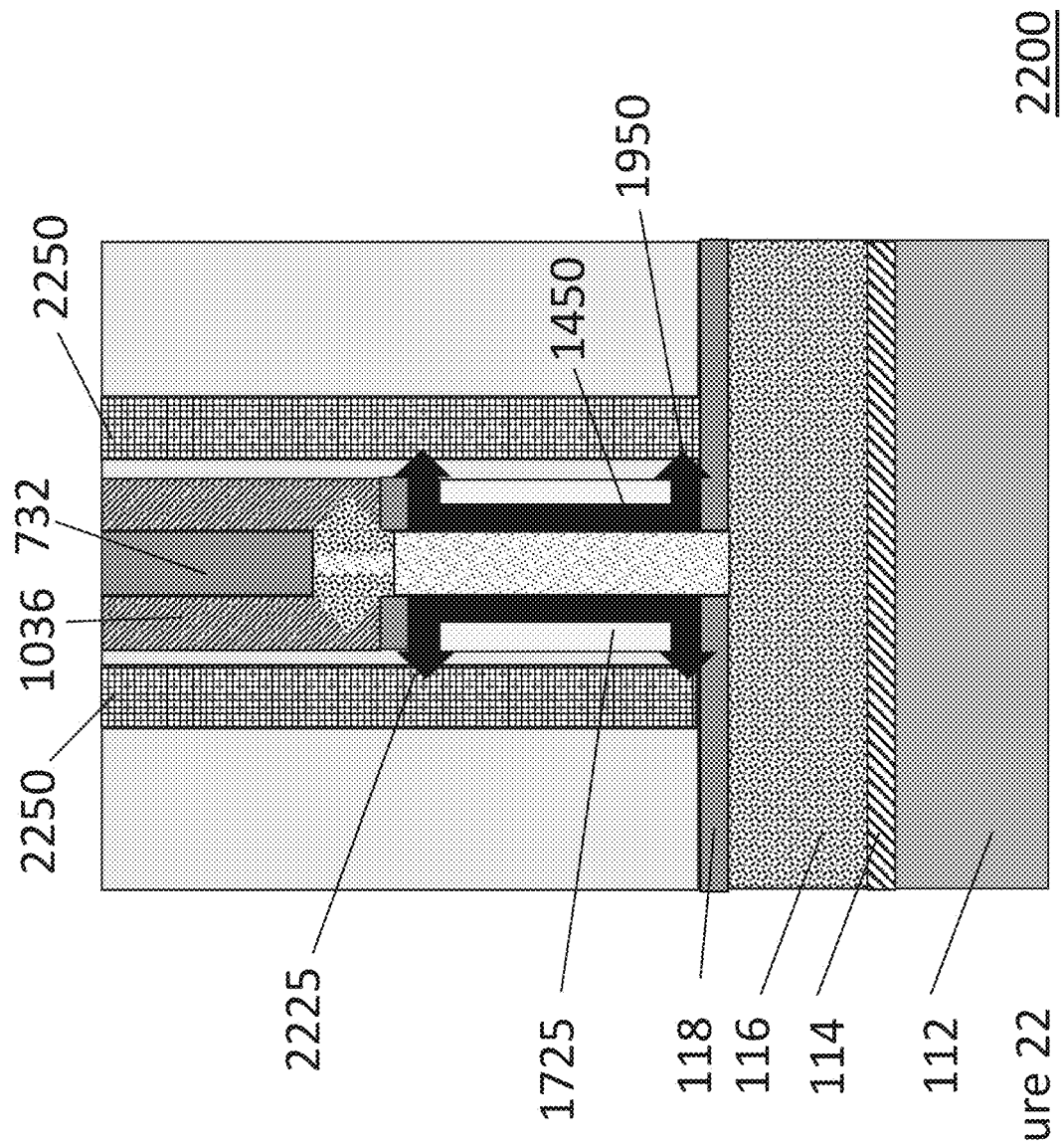
FIG. 22 is a cross-section view of the embodiment of a preliminary structure after the gate contact vias are filled with conductive material and a chemical/mechanical polishing (CMP) is performed.

FIG. 22 is a cross-section view of the embodiment of a preliminary structure 2200 after the gate contact vias 2150 are filled with conductive material, e.g. metal 2250, and a chemical/mechanical polishing (CMP) is performed.

The external electrical gate contacts 2250 can be formed or deposited using known metallization techniques. In some embodiments, the exposed, inner surface of the gate contact vias 2150 may be cleaned to remove any residual dielectric or poorly conducting films such as native oxides.

The gate contact vias 2150 are then filled with a conductive material 2250. In some embodiments, the conducting material 2250 includes a metal (e.g., titanium, tantalum, nickel, cobalt, zirconium, ruthenium, or rhodium), a conducting metallic compound material (e.g., titanium silicide or germanide, titanium nitride, tantalum nitride, tantalum carbide, titanium carbide, cobalt silicide or germanide, or nickel silicide or germanide), a conductive carbon, or any suitable combination of these materials. Other metals include, for example, aluminum (Al), platinum (Pt), gold (Au), tungsten (W), titanium (Ti), Cobalt (Co) or any combination thereof.

The conductive material 2250 may be deposited by a suitable deposition process, for example, CVD, PECVD, PVD, plating, thermal or e-beam evaporation, or sputtering.

In some embodiments, a silicide/germanide layer first may be formed in the gate contact vias 2150 trenches by, for example, silicidation (e.g., formation of an alloy including a portion of a contact material with an underlying silicon or germanium layer), before filling the gate contact vias 2150 with a remainder of electrically conductive material.

The conductive material 2250 serves to connect the semiconductor gate region 1450 to external electrical connections through gate extension area(s) 2125. As stated, the gate extension area(s) 2125 have a much smaller surface area than the area of the entire gate 1450. An interface 2225 is created on the semiconductor gate extension area 2125. The interface 2225 is between conductive material/metal 2250 and the semiconductor gate extension(s) 1950.

Minority carriers are created at this interface 2225. Since the area 2125 of the interface 2225 is much smaller than the area of the gate 1450, fewer minority carriers are generated at this interface 2225. Accordingly, fewer generated carriers enter the channel 730 from this source and device noise decreases. In other words, reducing the area 2125 of the metal 2250/semiconductor 1950 interface 2225 reduces the number of carriers generated at the interface 2225 and, therefore, reduces the number of noise-producing carriers available to enter the channel 730 from this interface 2225 source for a given potential barrier. The potential barrier to entering the channel is lowered by reducing the thickness of the gate region and increases by increasing the doping concentration in the gate region 1450. The reduced thickness (volume) of the gate region 1450 allows for higher doping levels in the gate region (thus maintaining a sufficiently high barrier height) without excessive minority carrier generation within the gate region 1450.

The layers (1725 and 2050V) form vertical insulators on the channel sidewall surface(s) 1330 that electrically insulate the external electrical gate contacts 2250 from the aggregate channel sidewall surface 1330 except where the gate extensions 1950 are exposed and make contact with the external electrical gate contacts 2250. In this way the interface 2225 area between conductive material/metal 2250 and the semiconductor gate extension(s) 1950 is kept as a small percentage of the aggregate channel sidewall surface 1330 so minority carrier generation at this interface 2225 is reduced.

In addition, because the thickness 1425 (and as a result, the volume) of the gate region 1450 is reduced, as shown in FIG. 14, the number of carriers generated and/or re-combined in the gate region 1450 dominated by Auger phenomenon is reduced. This further reduces the noise causing carriers available to enter the channel 730.

Figure 23:
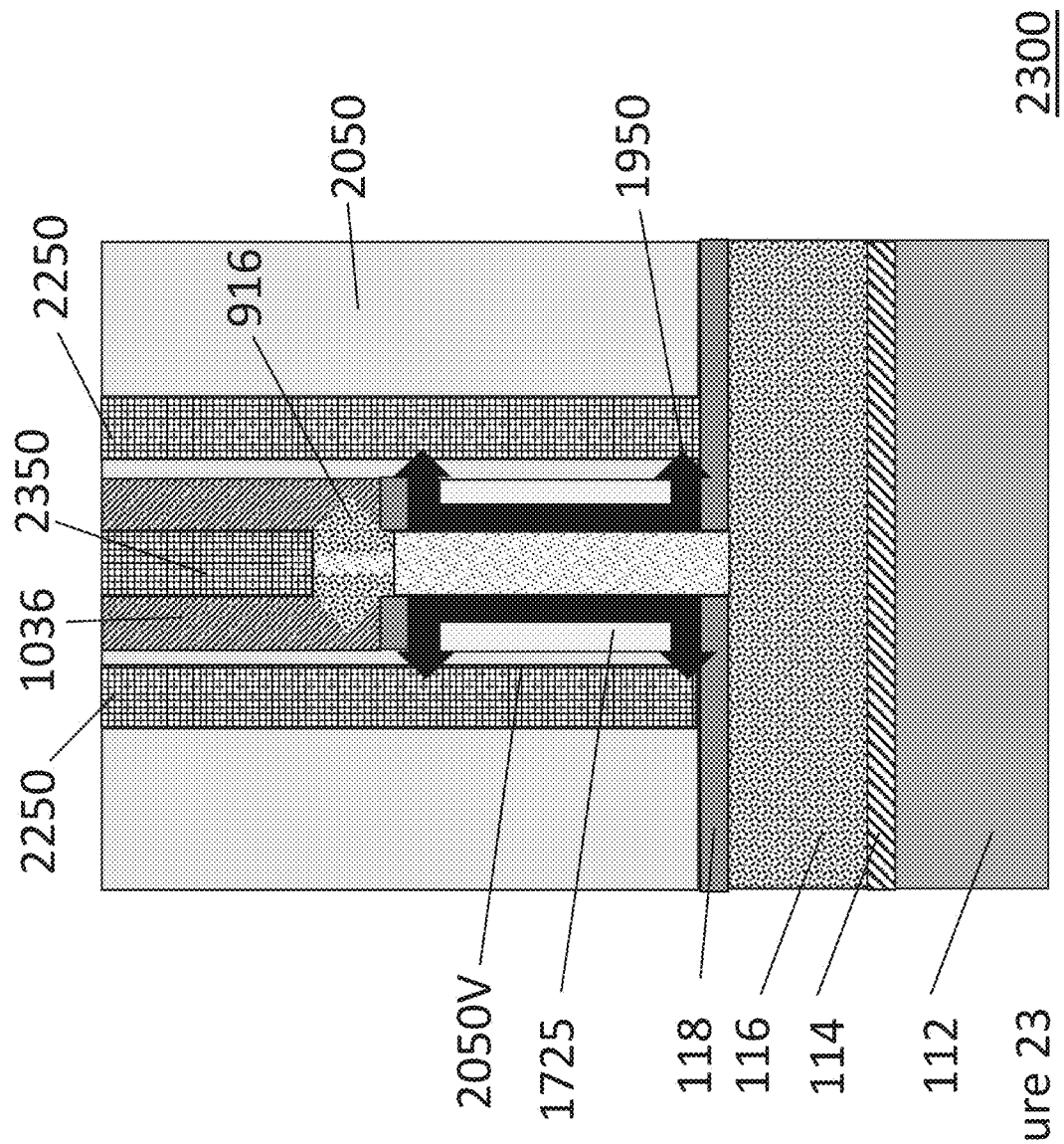
FIG. 23 is a cross-section view of an embodiment of one final structure after the protective material is replaced with conductive material to create a top S/D electrical contact.

FIG. 23 is a cross-section view of an embodiment of one final structure 2300 after the protective material 732 is replaced with S/D conductive material 2350 to create external electrical top S/D contact 2350.

The protective material 732 is removed using known chemistries selective to the protective material 732. The resulting space is filled with conductive material 2350 and using methods as described above for the gate conductive material 2250. The deposited S/D conductive material 2350 forms an external electrical top S/D contact 2350 to the top source/drain (S/D) region 916.

In like manner, using the same processes and materials, a connection pattern/mask can be formed over the bottom source/drain regions 116. For example, a long shallow via/trench (not shown here, top view shown in FIG. 24) is etched, e.g. using RIE, to recess through the ILD 2050 and bottom spacer layer 118. The via/trench is then filled with conductive material 2450 (shown in FIG. 24) to create an external electrical bottom S/D contacts 2450, as discussed for the external electrical top S/D contacts 2350 and the external electrical gate contacts 2250

Figure 24:
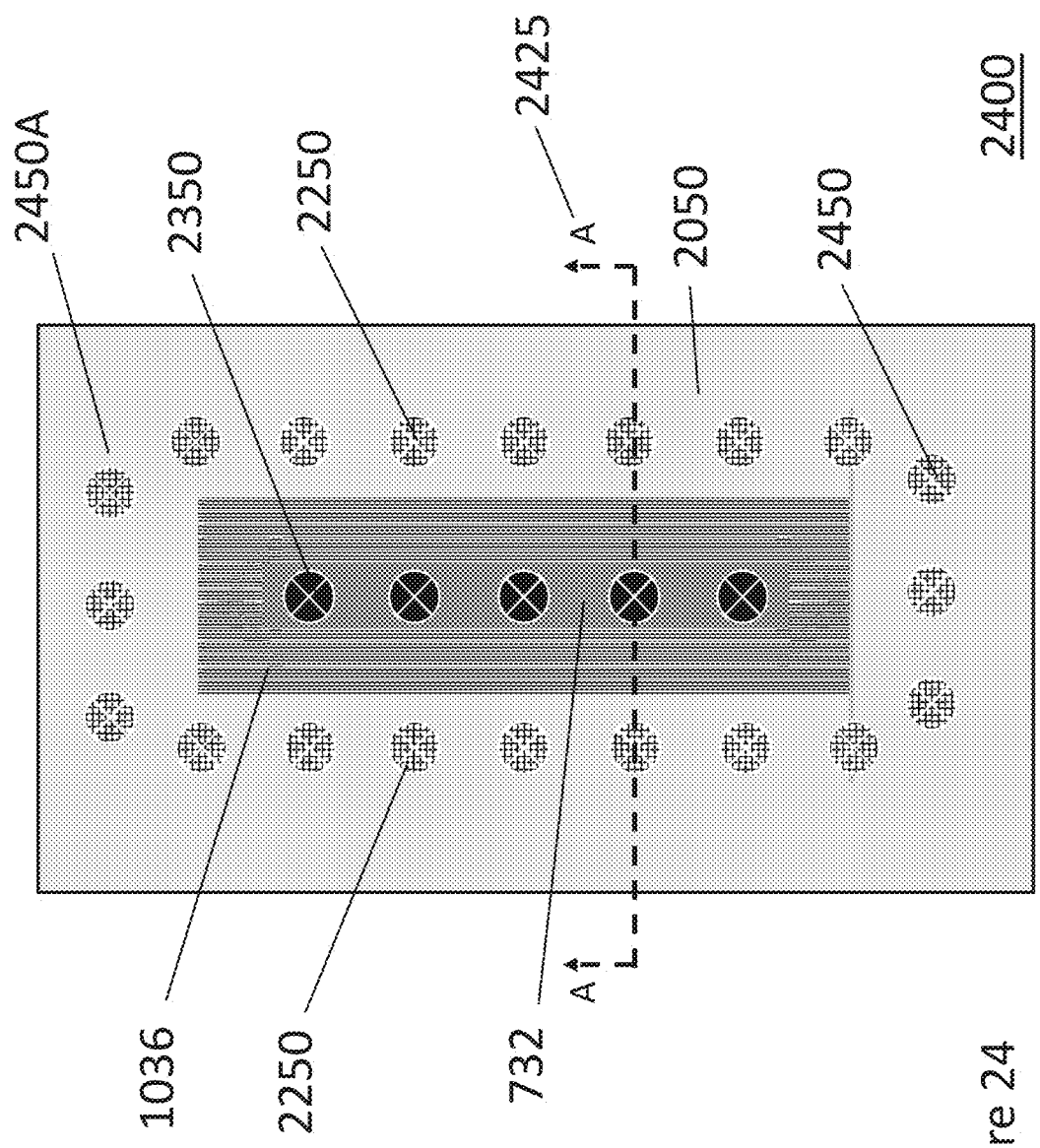
FIG. 24 is a top view of one embodiment of a final structure showing external electrical connections to the gate, a top S/D, and a bottom S/D.

FIG. 24 is a top view of one embodiment of a final structure 2400 showing external electrical connections to the gate 2250, a top S/D 2350, and a bottom S/D 2450.

Cross-section A-A 2425 shows a plan cut line defining an example cross-section view shown in FIGS. 1-23 for various example preliminary structures made by different method steps disclosed.

In this top view of final structure 2400 one or more, e.g. multiple, external electrical connections are made to each of the gate 2250, top S/D 2350, and/or bottom S/D 2450. In alternative embodiments, for example, where the gate region 1450 continuously wraps around the channel 730, a single external connection might be enough, e.g. for the gate 2250 contact. Different cross-sectional shapes of the connections (2250, 2350, and 2450) are envisioned.

In addition, the external electrical connections to the gate 2250, top S/D 2350, and bottom S/D 2450 can be formed simultaneously, or in separate steps using the descriptions above.

Also note that since the cross-section elevation views disclosed above are taken through an example cross-section like A-A 2425, the external electrical bottom S/D contacts 2450 (and/or 2450A) are not shown in these cross-section 2425 views. However, the external electrical bottom S/D contacts 2450 are similar to the shown external electrical top S/D contacts 2350 in some embodiments. Example positioning of the external electrical bottom S/D contacts 2450 are shown as 2450 and/or 2450A in the top view of the structure 2400.

The set of Figures including FIG. 1 through 24 complete the description of one series of embodiments of JFET structures and methods of making one embodiment of JFET structures.

The set of Figures including FIG. 25 through FIG. 28 are now presented to describe an alternative series of embodiments of JFET structures and methods of making the JFET structures. This set of embodiments disclose JFET structures with a single gate extension 2750, typically centered on the gate region 1450.

Figure 25:
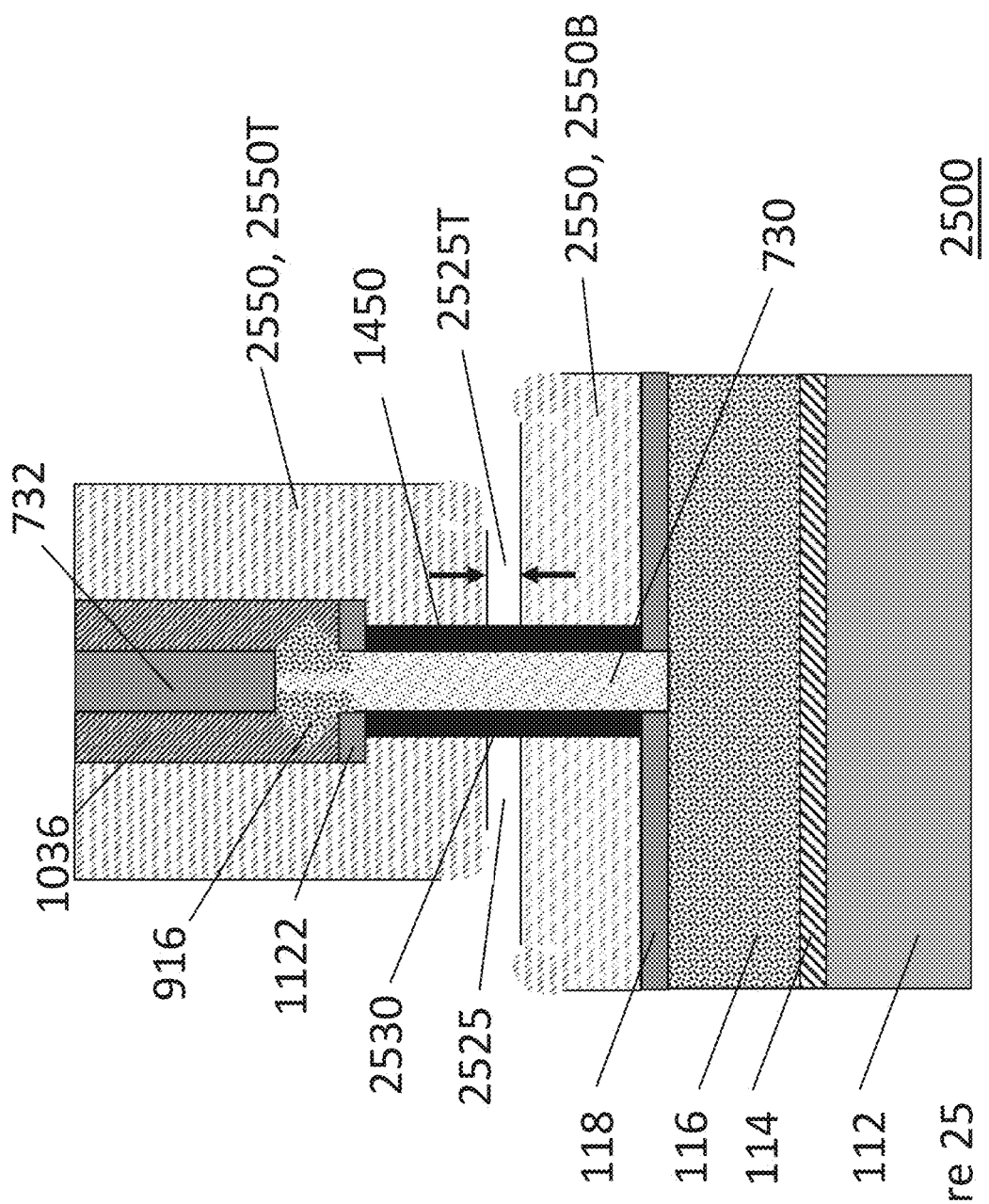
FIG. 25 is a cross-section view of a first alternative embodiment of a preliminary structure created after the structure in FIG. 14 undergoes a deposition of a selective dielectric material to create a center gap exposing a center region of the gate.

FIG. 25 is a cross-section view of one alternative embodiment of a preliminary structure 2500 created after the structure 1400 in FIG. 14 undergoes a deposition of a selective dielectric material 2550 to create a center gap 2525 exposing a center region 2530 of the gate 1450.

In this embodiment, the dielectric material 2550 is conformally deposited for a longer time and at a greater thickness than the deposition described in FIG. 15. As before, the selective dielectric material 2550 deposits conformally only on dielectric surfaces. The selective dielectric material 2550 does not adhere/deposit on the semiconductor material of the gate region 1450.

Accordingly, the deposition and thickness of the dielectric material (2250, 2550B) continues to grow upward from the bottom spacer layer 118. Simultaneously, the selective dielectric material (2550, 2550T) deposition and thickness increases downward below the top spacer 1122 and surrounds the protective spacer 1036. Deposition timing and other deposition parameters are adjusted until a center gap 2525 with a center gap thickness 2525T is formed. The center gap 2525 is formed on two or more sides, e.g. all-around, the channel 730 and is approximately centered between the top spacer 1122 and bottom spacer layer 118. The deposition of the selective dielectric material 2550 can be done using the same methods and materials as described in FIG. 15. In some embodiments, the center gap thickness 2525 is between 4 nm and 10 nm, or between 4 nm and 6 nm. Other thicknesses are envisioned.

Figure 26:
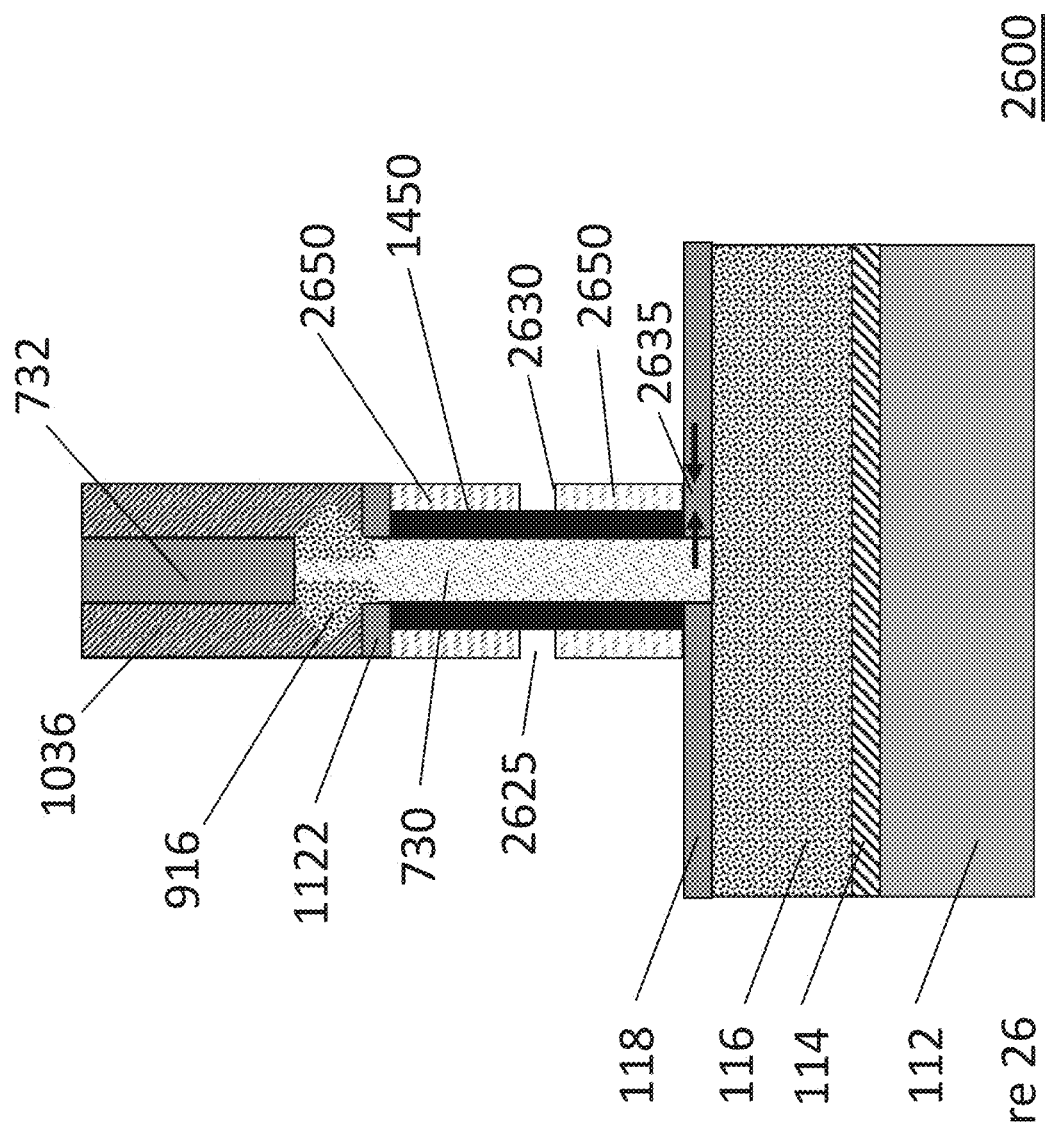
FIG. 26 is a cross-section view of a first alternative embodiment of a preliminary structure after a directional etching step removes the selective dielectric material in regions not protected by the protective spacer from the preliminary structure of FIG. 25.

FIG. 26 is a cross-section view of the alternative embodiment of a preliminary structure 2600 after a standard directional etching step removes the selective dielectric material 2550 in regions not masked by the protective spacer 1036. The center gap 2625 has a short center gap thickness 2630. The center gap width (2630, 2635) is equal to the width 2635 of the vertical thicknesses 2650 of the selective dielectric material 2550 that remains around the gate region 1450 between the bottom spacer layer 118 and the top spacer 1122. In some embodiments, center gap width 2635 and therefore the length of the gate 1450 extension 2750, is small, to have a small metal contact area to gate and gate 1450 extension 2750 volume and therefore small carrier generation-recombination.

Figure 27:
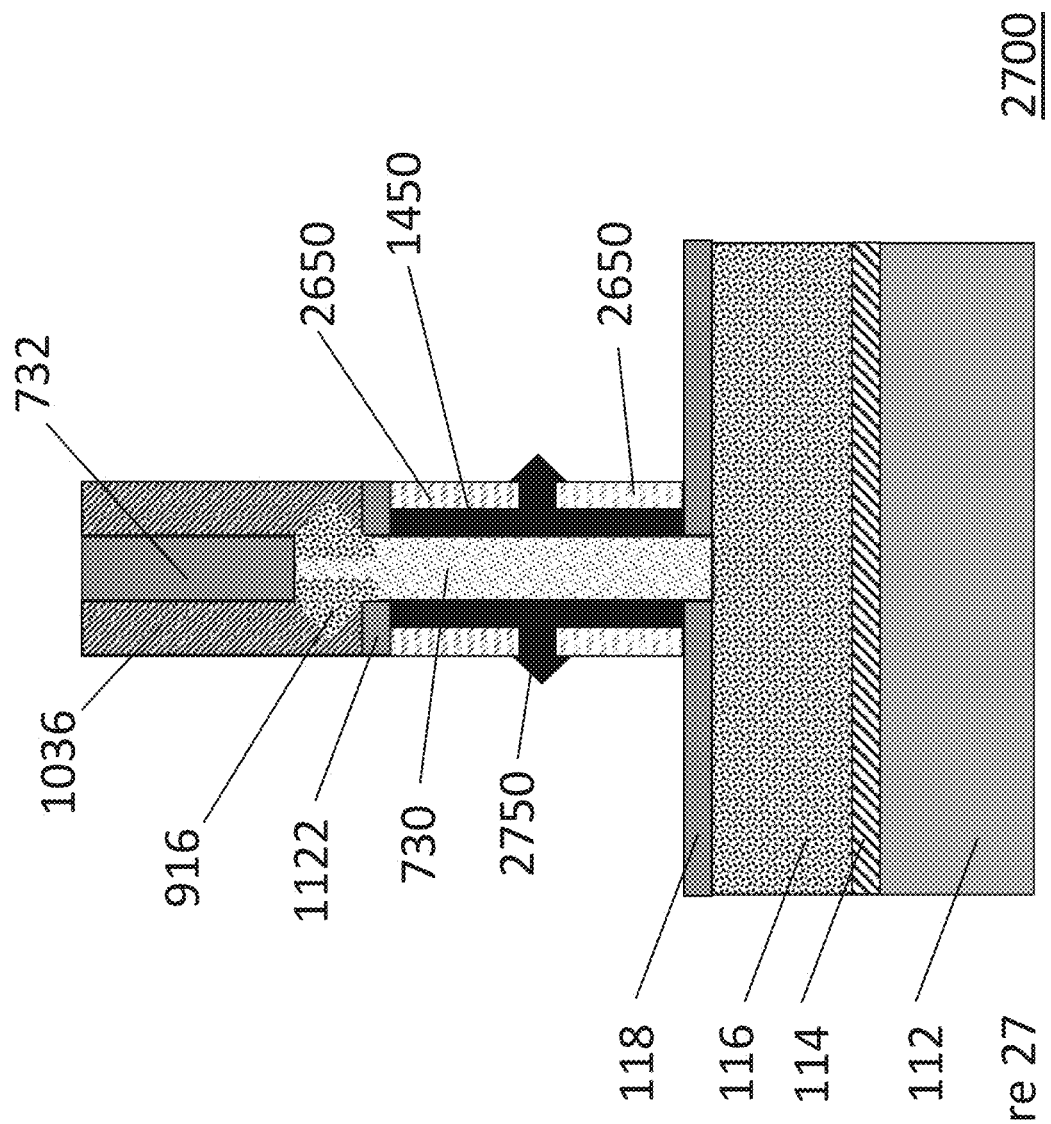
FIG. 27 is a cross-section view of the embodiment of a preliminary structure after an epitaxial growth of gate semiconductor material/extension into the center gap.

FIG. 27 is a cross-section view of the alternative embodiment of a preliminary structure 2700 after an epitaxial growth of gate semiconductor material into the center gap 2625. The epitaxial growth is performed as described in FIG. 19 and creates a center gate extension 2750.

Figure 28:
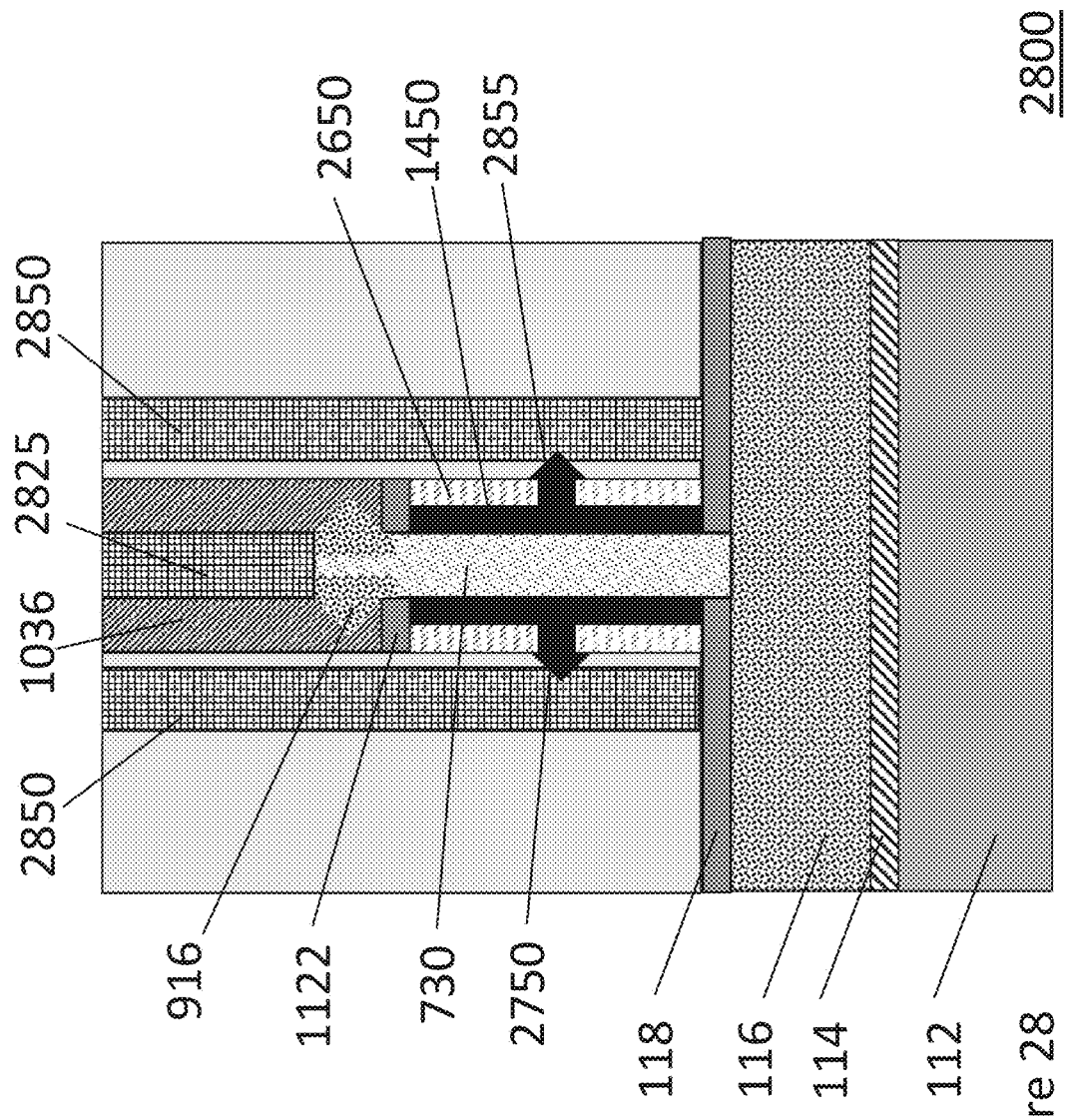
FIG. 28 is a cross-section view of an alternative embodiment of a final structure showing external electrical connections to the gate and a top S/D, where the external electrical connection to the gate is made through a center semiconductor connection/extension in the center gap.

FIG. 28 is a cross-section view of the alternative embodiment of a final structure 2800 showing external electrical connections to the gate 2850 and a top S/D 2825, where the external electrical connection 2850 to the gate 1450 is made through the surface area interface 2855 to the center gate extension 2750 residing in the center gap 2625.

In this embodiment, as compared with embodiments with two or more gate extensions 1950, the area of the interface 2855 between the conductive/metal contact 2850 and gate semiconductor 2750 can be reduced further, e.g. cut in half approximately assuming gap lengths of about the same size, because there is only one gate extension 2750 connecting the gate 1450 to the external gate connection 2850. As a result, less noise is produced from this interface 2855 in this embodiment. However, since the overall contact area between the conductive/metal contact 2850 and gate semiconductor 2750 is reduced (e.g. cut in half), the series resistance associated with the gate terminal is increased. A higher series resistance results in lower operation speed and bandwidth. Therefore, this embodiment is particularly beneficial for applications which require very low noise but are relatively less demanding in terms of operation speed.

The external electrical connections to the gate 2750, top S/D 2825, and bottom S/D (not shown) can be made and positioned as described above.

Figure 29:
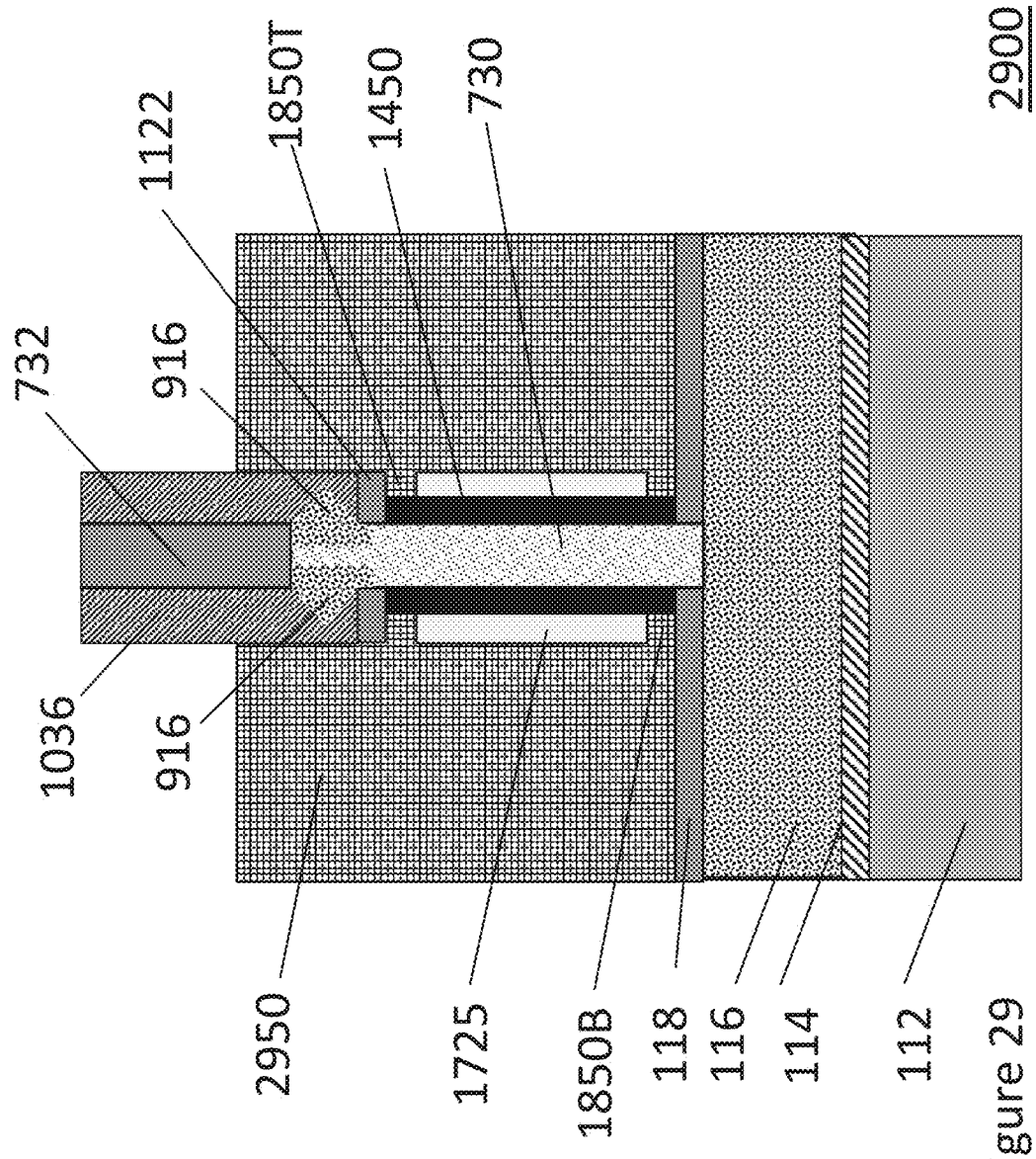
FIG. 29 is a cross-section view of another alternative embodiment of a preliminary structure after a structure like that in FIG. 18 undergoes a conductive material (e.g. metal) deposition step.
Figure 30:
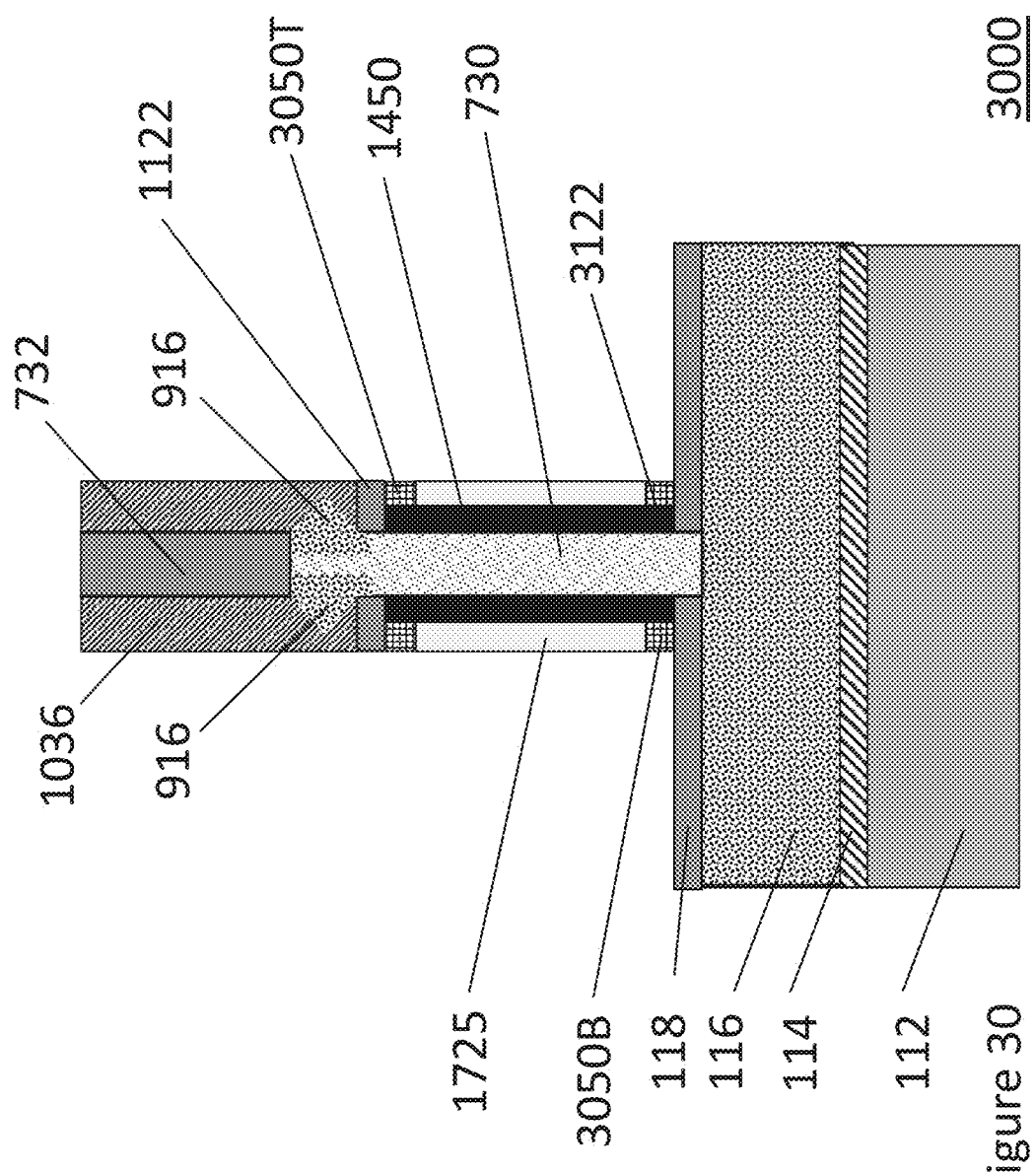
FIG. 30 is a cross-section view of one embodiment of a preliminary structure after a directional etching step removes the conductive material in regions not protected by the protective spacer.
Figure 31:
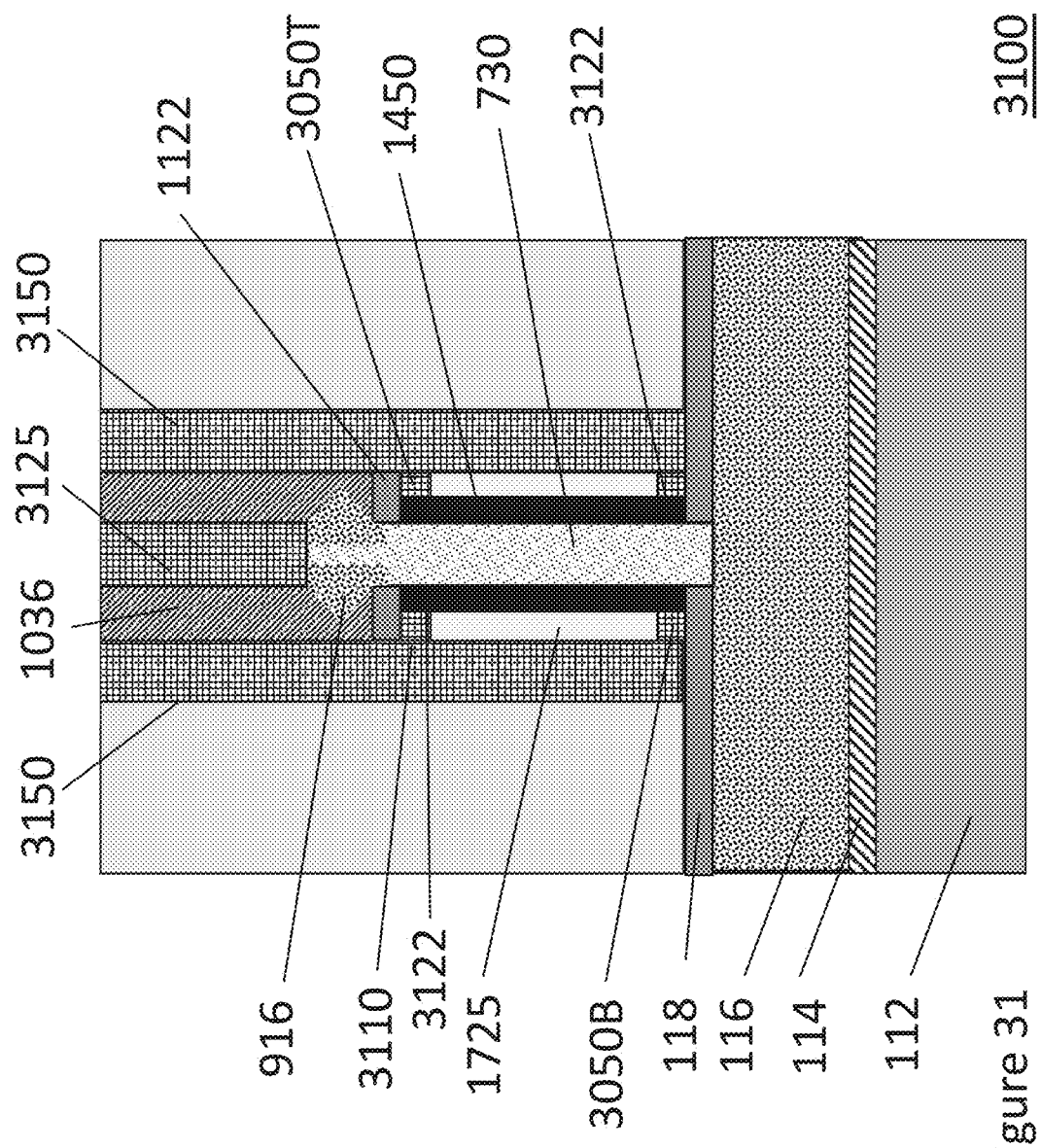
FIG. 31 is a cross-section view of one embodiment of a cross-section view of another alternative final structure showing external electrical connections to the gate and a top S/D, where the external electrical connection to a top and a bottom connection to the gate are made with a conductive material/extension.

FIGS. 29 through 31 disclose another alternative embodiment of the present invention.

FIG. 29 is a cross-section view of one embodiment of a preliminary structure 2900 after a structure 1800 like that in FIG. 18 undergoes a conductive material (e.g. metal) 2950 deposition step.

In this embodiment, a conductive material 2950 is deposited on a structure like 1800. The conductive material 2950 covers the surface of the bottom spacer layer 118 and surrounds the channel 730, the vertical thicknesses of hard mask 1725, top spacer 1122, and the protective spacer 1036 (partially). The top gap 1850T and bottom gap 1850B are also filled with the conductive material 2950.

The conductive material (2950, 2250) can be any material capable of forming an external electrical contact with gate region 1450. The conductive material (2950, 2250) can be of the type and deposited by the methods described in the description of FIG. 22.

FIG. 30 is a cross-section view of one embodiment of a preliminary structure 3000 after a directional etching step removes the conductive material 2950 in regions not protected/masked by the protective spacer. A top gap connection 3050T and a bottom gap connection 3050B are formed by the conductive material 2950 that fills the top gap 1850T and bottom gap 1850B, respectively. The top gap connection 3050T and a bottom gap connection 3050B each are in electrical contact with the channel 730. At these contacts there is a gap connection interface 3122 with the semiconductor surface of the gate region 1450.

FIG. 31 is a cross-section view of one embodiment of a cross-section view of an alternative final structure 3100 showing external electrical connections to the gate 3150 and the top S/D 3125. The external electrical gate connection 3150 connects to the gate 1450 through the top 3050T and bottom 3050B connection/extension. The external electrical connection to the bottom layer source/drain (S/D) region/layer 116 is not shown in this view but can be like that previously described. Materials, structures, and methods of deposition for the external electrical connections (3125, 3150) are as described above.

Since in this embodiment, the external electrical connection(s) to the gate 3150 is made through the top gap connection/extensions 3050T and a bottom gap connection/extension 3050B, there is no need to epitaxially grow gate extensions 1950.

The metal contact to gate semiconductor interface/junction (interface) 3122 between the conductive/metal and semiconductor surface of the gate region 1450 occurs within the top gap 1850T and bottom gap 1850B. Even though there are two interfaces 3122, these noise producing interfaces 3122 are still minimized because of the small thicknesses, 1825T and 1825B, of the respective top gap 1850T and bottom gap 1850B and the resulting small area of the interfaces 3122.

Figure 32:
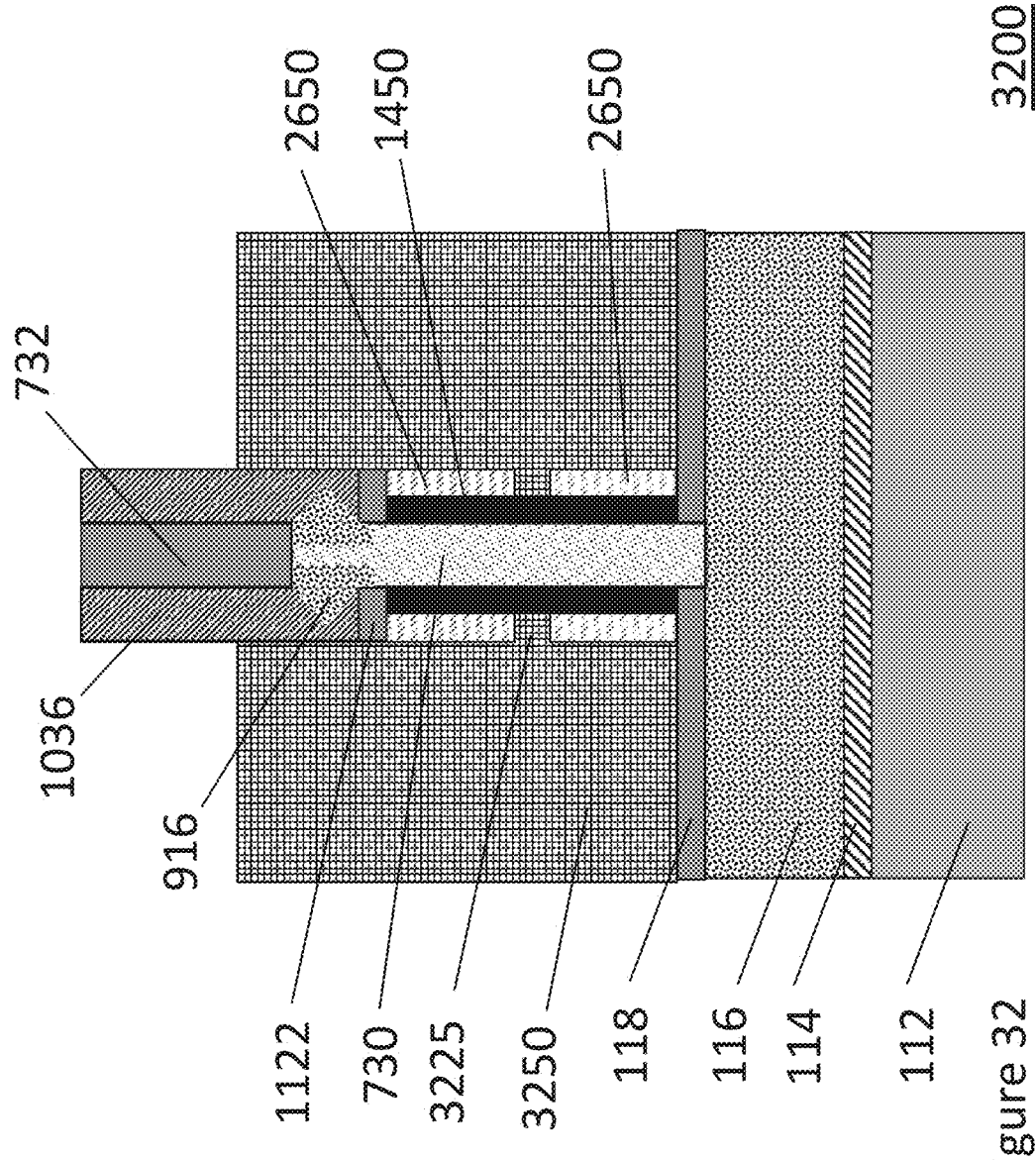
FIG. 32 is a cross-section view of still another embodiment of a preliminary structure after a structure like that in FIG. 26 undergoes a conductive material (e.g. metal) deposition step.
Figure 33:
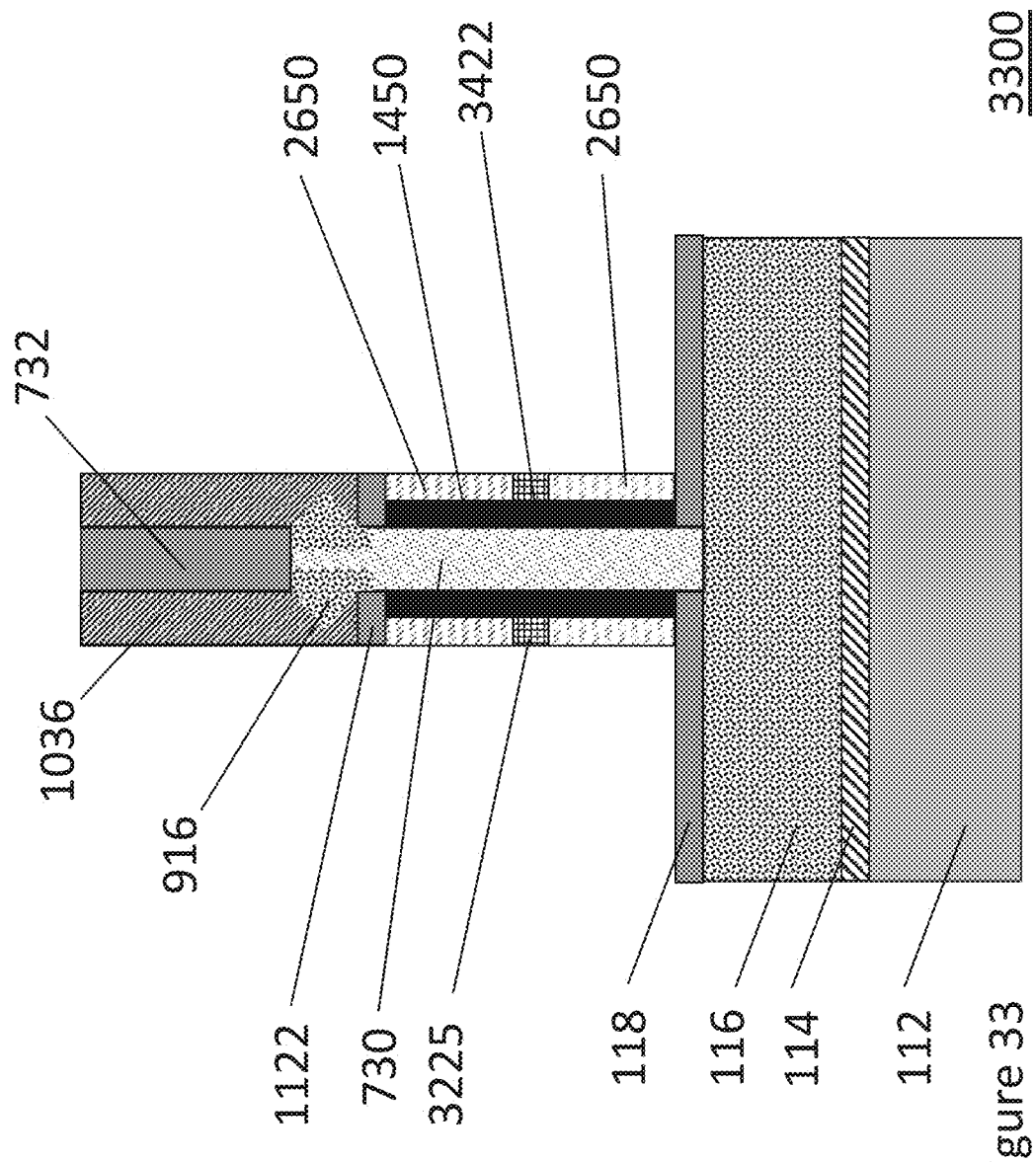
FIG. 33 is a cross-section view of one embodiment of a preliminary structure after a directional etching step removes the conductive material in regions not protected by the protective spacer.
Figure 34:
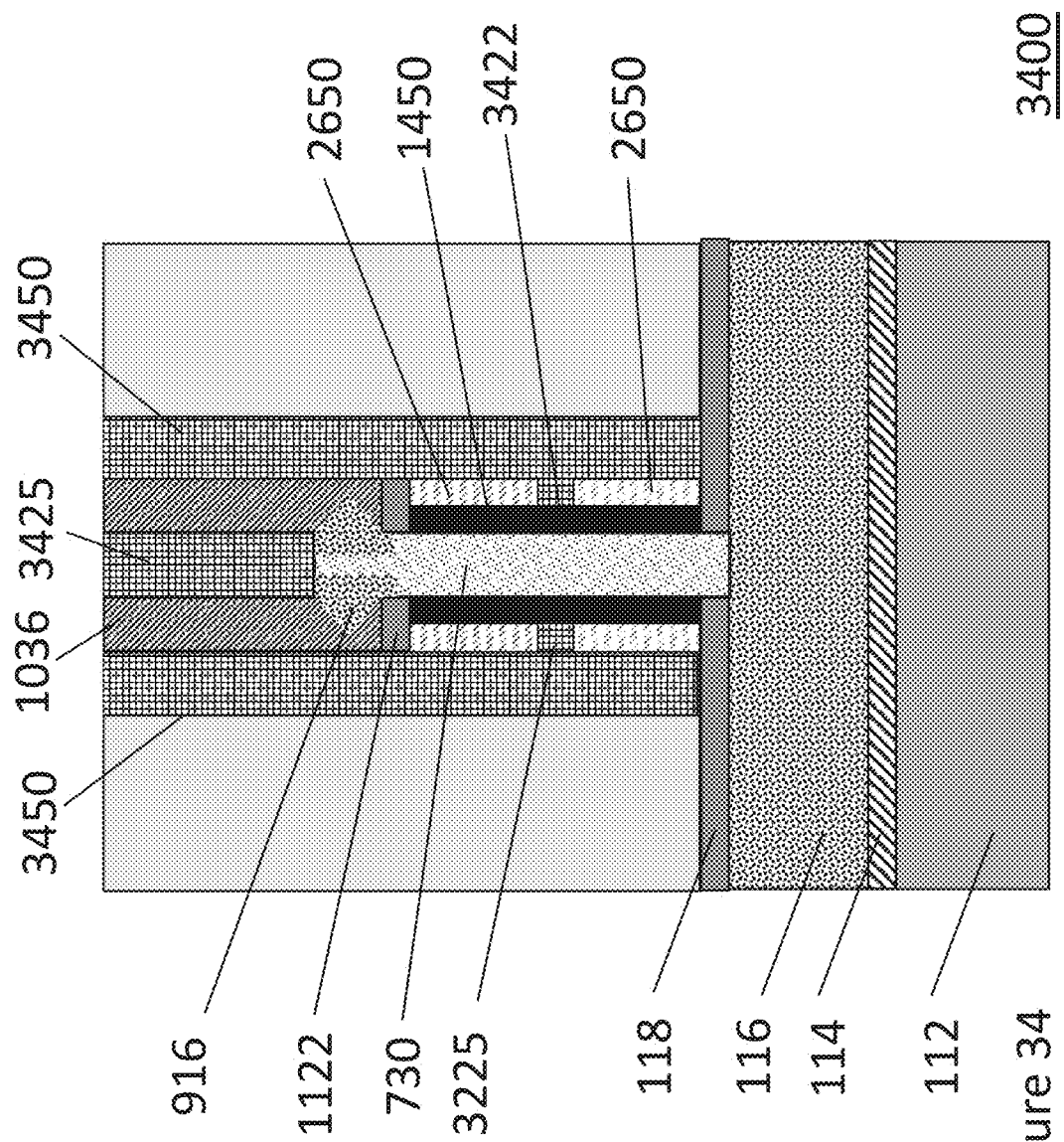
FIG. 34 is a cross-section view of one embodiment of a cross-section view of the still another alternative final structure showing external electrical connections to the gate and a top S/D, where the external electrical connection to a center connection to the gate are made with a conductive material/extension.

FIGS. 32 through 34 disclose still another alternative embodiment of the present invention. This embodiment has a single, center gap, direct conductive connection/extension to the gate 1450.

FIG. 32 is a cross-section view of one embodiment of a preliminary structure 3200 after a structure 2600 like that in FIG. 26 undergoes a conductive material (e.g. metal) 3250 deposition step.

The conductive material 3250 deposition is like that described in the description of FIG. 29. However, in this embodiment, the conductive material 3250 fills 3225 a single center gap 2625 located in the (vertical) center of the gate region 1450.

FIG. 33 is a cross-section view of one embodiment of a preliminary structure 3300 after a directional etching step removes the conductive material 3250 in regions not protected/masked by the protective spacer 1036. The conductive material 3225 remaining in the single center gap 2625 forms a single center gap connection/extension 3225.

As before, in this embodiment there is no need to epitaxially grow a gate extension 1950. The single center gap connection/extension 3225 forms a metal contact to gate semiconductor interface/junction interface 3422.

FIG. 34 is a cross-section view of one embodiment of a cross-section view of an alternative final structure 3400 showing external electrical connections to the gate 3450 and a top S/D 3425, where the external electrical gate connection 3450 to the gate 1450 is made through the single center gap connection/extension 3225.

In this embodiment, there is only one metal contact to gate semiconductor interface 3422 which is within the center gap 2625. The single interface 3422 with the small thickness/surface area highly reduces noise caused by carrier generation and/or recombination at this interface 3422.

Figure 35:
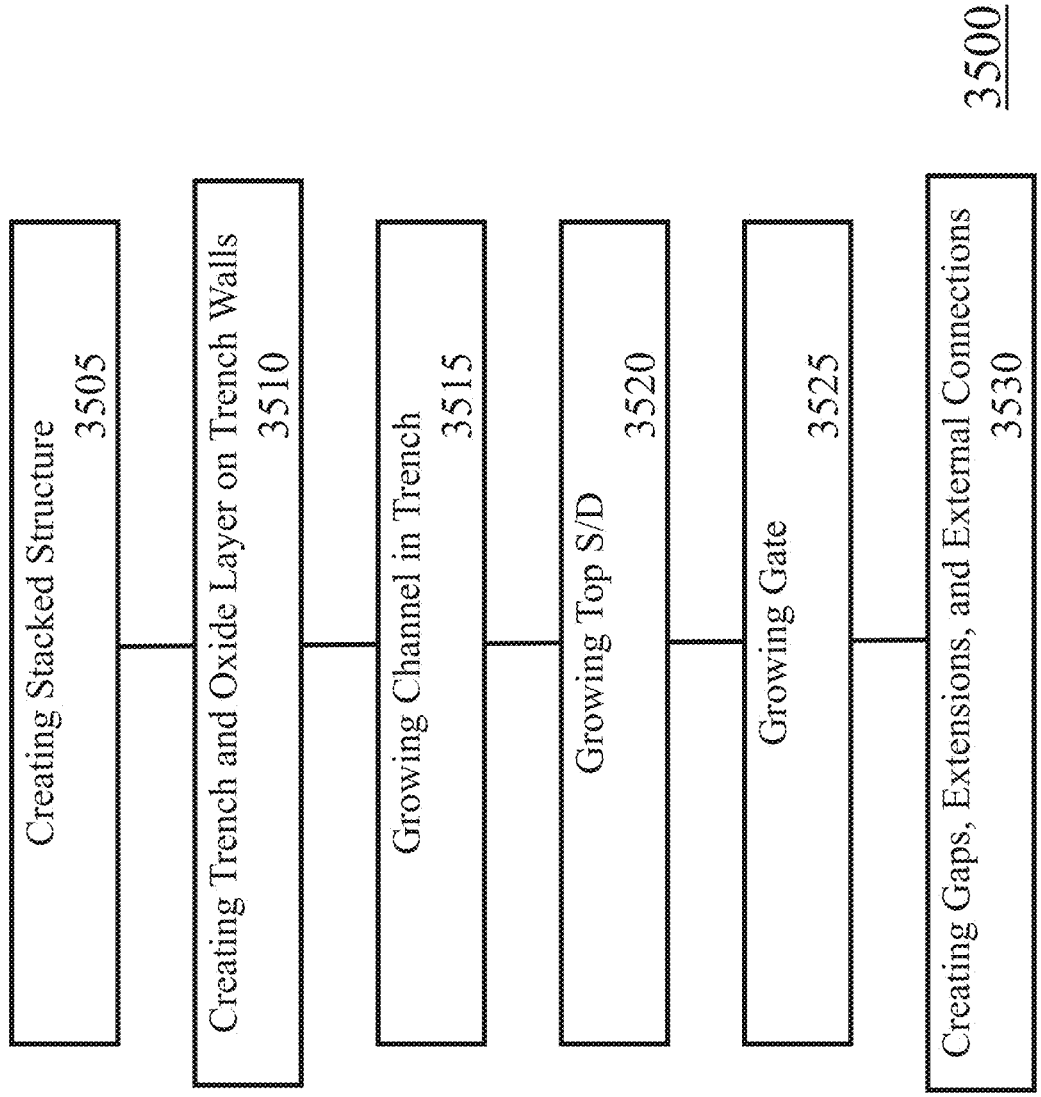
FIG. 35 is a flow chart of an embodiment of a process for making a low-noise JFET.

FIG. 35 is a flow chart of one embodiment of a process 3500 for making a low-noise JFET.

The process 3500 begins with step 3505 by creating a stacked structure 100 with a substrate layer 112 (a counter doped layer 114 can be included), a bottom source/drain (S/D) layer 116 disposed on the substrate layer 112, a bottom spacer layer 118 disposed on the bottom S/D layer 116, a sacrificial layer 120 disposed on the bottom spacer layer 118, a top spacer layer 122 disposed on the sacrificial layer 120, and an oxide layer 124 disposed on the top spacer layer 122, as described above.

In step 3510 a vertical trench 126 is made through the oxide 124, top spacer 122, and sacrificial 120 layers and ultimately through the bottom spacer layer 118 exposing a bottom of the vertical trench 127 to the bottom S/D layer 118. A vertical oxide layer 128 is formed on one or more of the sides of the sacrificial layer 120 facing the vertical trench 126 prior to punching through the bottom spacer layer 118.

In step 3515, the channel 530 is epitaxially grown from the bottom S/D layer 116 upwards through the vertical trench 127. The channel 530 has one or more one or more channel sidewall surfaces 1330. A CMP removes the excess channel material 531 and the top of the channel (530, 630) is recessed so that a protective material layer 732 can cap the top of the resulting channel 730. The oxide layer 124 is removed.

In step 3520, the top S/D 916 is epitaxially grown on one or more of the channel 730 sidewall surfaces 1330 above the top spacer layer 122.

In step 3525 the protective spacer 1036 is formed and various etching steps are performed, as described in the description of FIGS. 11 through 13, prior to the gate 1450 being epitaxially grown on one or more of the channel sidewall surfaces 1330 (e.g. gate 1450 all-around) between the top 1125 and bottom 118 spacer. In some embodiments, the gate thickness 1425 is controlled to remain between 3 nm and 10 nm.

In step 3530 various material deposition and removal steps are performed to create gaps like 1850T, 1850B, 2625, as described in FIGS. 15 through 18 and similar descriptions of the alternative embodiments. For example, one or more vertical insulating layers (1725, 2050V) cover most of the gate 1450, except where there are gaps (1850T, 1850B, 2625) that expose areas of connection to the gate 1450.

Connections or extensions (e.g. 1950, 2750, 3050T, 3050B, 3225) are created to fill the gaps (1850T, 1850B, 2625, 3050T, and 3050B). The interfaces (e.g. 2225, 2855, 3122, and 3422) between the gate 1450 and one or more external electrical gate contacts (e.g., 2250, 2850, 3150, and 3450) have a much smaller area than the total area of the channel sidewall surfaces 1330.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. For example, the semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, etc. Systems and hardware incorporating the semiconductor devices are contemplated embodiments of the invention.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product.

The terminology used herein was chosen to explain the principles of the embodiments and the practical application or technical improvement over technologies found in the marketplace or to otherwise enable others of ordinary skill in the art to understand the embodiments disclosed herein. Devices, components, elements, features, apparatus, systems, structures, techniques, and methods described with different terminology that perform substantially the same function, work in the substantial the same way, have substantially the same use, and/or perform the similar steps are contemplated as embodiments of this invention.

We claim:

1. A Vertical Junction Field Effect Transistor (VJFET) comprising:
    a substrate;
    a source disposed on the substrate;
    a drain;
    a channel, the channel having a source end, a drain end, and one or more channel sidewall surfaces with a total channel sidewall surface area, the source being electrically connected to the source end, the drain being electrically connected to the drain end, and the channel being perpendicular to the substrate;
    a gate, the gate being an electrically conductive material disposed on one or more of the channel sidewall surfaces;
    one or more external electrical drain contacts connected to the drain;
    one or more external electrical source contacts connected to the source;
    one or more gate extensions; and
    one or more external electrical gate contacts, each external electrical gate contact connected to the gate at one or more gate interfaces, each of the gate interfaces having a gate interface area smaller than the channel sidewall surface area, each gate interface being an end of one of the gate extensions, the gate extensions being between the gate interface and the external electrical gate contact, the gate extension electrically connecting the external gate contact to the gate at the respective gate interface.

2. A VJFET, as in claim 1, further comprising one or more vertical insulators disposed on the gate that is not the gate interface area.

3. A VJFET, as in claim 2, where the gate extensions have a gate extension thickness is less than 10 nanometers (nm).

4. A VJFET, as in claim 2, where the gate extension comprises an upper gate extension and a lower gate extension.

5. A VJFET, as in claim 2, where the gate extension comprises a single, central gate extension.

6. A VJFET, as in claim 2, one or more of the vertical insulators on the channel sidewall surface electrically insulates the external electrical gate contacts from the gate except where the gate extensions are exposed to and make electric contact with the external electrical gate contacts.

7. A VJFET, as in claim 2, where the gate extensions are made of the same semiconductor material as the gate.

8. A VJFET, as in claim 2, where one or more of the external electrical gate contacts further comprises one or more metallic gap connections replacing the gate extensions, each of the metallic gap connections having a gap connection interface in direct electrical contact with the gate and the metallic gap connection connecting the external electrical gate contact with the gate.

9. A VJFET, as in claim 8, where the metallic gap extensions have a gap connection thickness less than 10 nm.

10. A VJFET, as in claim 8, where one or more of the external electrical gate contacts comprises an upper metallic gap connection and a lower metallic gap connection.

11. A VJFET, as in claim 8, where the metallic gap connection comprises a single, central gap connection.

12. A VJFET, as in claim 8, further comprising one or more vertical insulators on the gate between the metallic gap connections, the vertical insulators electrically insulating the external electrical gate contacts from the gate except where the metallic gap connections make electric contact with the gate.

13. A VJFET, as in claim 1, where the gate has a gate thickness less than 10 nanometers along the channel.

14. A Vertical Junction Field Effect Transistor (VJFET) comprising:
    a substrate;
    a source disposed on the substrate;
    a drain;
    a channel, the channel having a source end, a drain end, and one or more channel sidewall surfaces with a total channel sidewall surface area, the source being electrically connected to the source end, the drain being electrically connected to the drain end, and the channel being perpendicular to the substrate;
    a gate, the gate being an electrically conductive material disposed on one or more of the channel sidewall surfaces;
    one or more external electrical drain contacts connected to the drain;
    one or more external electrical source contacts connected to the source;

one or more gate extensions; and one or more external electrical gate contacts, each external electrical gate contact connected to one or more of the gate extensions and through the gate extension to the gate at one or more gate interfaces, each of the gate interface being between one of the gate extensions and the gate, each of the gate interfaces having a gate interface area, the gate extension being between and electrically connected to the external electrical gate contact and the gate, wherein the gate has a gate thickness less than 10 nanometers along the channel and wherein each of the gate interface areas is smaller than the total channel sidewall surface area.

15. The VJFET, as in claim 14, where the gate extensions are made of the same electrically conductive material as the gate.

16. The VJFET, as in claim 15, where the gate extensions have the same doping level as the gate.

17. The VJFET, as in claim 14, where the gate extensions are made of metal.

18. The VJFET, as in claim 17, where the gate extensions and external electrical gate contacts are made of the same metal.

19. The VJFET, as in claim 14, where each of the gate extensions has a gate extension thickness.

20. The VJFET, as in claim 19, where the gate extension thickness is between 4 nanometers (nm) and 10 nm.

* * * * *